(12) United States Patent
Hara et al.

(10) Patent No.: US 8,633,044 B2
(45) Date of Patent: Jan. 21, 2014

(54) DISPLAY DEVICE AND METHOD FOR FABRICATING SAME

(75) Inventors: Yoshihito Hara, Osaka (JP); Yukinobu Nakata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/979,302

(22) PCT Filed: Jan. 25, 2012

(86) PCT No.: PCT/JP2012/000470
§ 371 (c)(1),
(2), (4) Date: Jul. 11, 2013

(87) PCT Pub. No.: WO2012/105189
PCT Pub. Date: Aug. 9, 2012

(65) Prior Publication Data
US 2013/0302929 A1 Nov. 14, 2013

(30) Foreign Application Priority Data
Feb. 1, 2011 (JP) ................. 2011-019644

(51) Int. Cl.
*H01L 21/84* (2006.01)
(52) U.S. Cl.
USPC ............. 438/30; 438/158; 257/E21.561
(58) Field of Classification Search
USPC ............. 436/30, 151–166; 257/E21.561
See application file for complete search history.

(56) References Cited

U.S. PATENT DOCUMENTS

| 5,756,372 A * | 5/1998 | Wakui et al. ............ 438/30 |
| 6,204,907 B1 | 3/2001 | Hiraishi et al. |
| 2001/0046024 A1 | 11/2001 | Hiraishi et al. |
| 2003/0103181 A1 | 6/2003 | Imayama et al. |
| 2009/0141223 A1 | 6/2009 | Hayashi |

FOREIGN PATENT DOCUMENTS

| JP | 09-090373 A | 4/1997 |
| JP | 2003-167258 A | 6/2003 |
| JP | 2004-53815 A | 2/2004 |
| JP | 2009-139394 A | 6/2009 |

OTHER PUBLICATIONS

Official Communication issued in International Patent Application No. PCT/JP2012/000470, mailed on Apr. 24, 2012.

* cited by examiner

*Primary Examiner* — Richard Booth
(74) *Attorney, Agent, or Firm* — Keating & Bennett, LLP

(57) ABSTRACT

In a display region of an active matrix substrate, an interlayer insulating film made of a photosensitive organic insulating film, an insulating film different from the interlayer insulating film, and a plurality of pixel electrodes formed on a surface of the interlayer insulating film are provided. In a non-display region of the active matrix substrate, a lead line extended from the display region is formed. In a formation region for a sealing member, the interlayer insulating film is removed, the insulating film is provided to cover part of the lead line, and the sealing member is formed directly on a surface of the insulating film.

13 Claims, 22 Drawing Sheets

DISPLAY DEVICE AND METHOD FOR FABRICATING SAME

TECHNICAL FIELD

The present invention relates to display devices and methods for fabricating the same.

BACKGROUND ART

In recent years, development in thin display devices such as liquid crystal display devices and organic EL display devices has been rapidly advanced. In many cases, these thin display devices include active matrix substrates on which switching elements each configured to drive associated one of a plurality of pixels are provided to the pixels in order to enhance display quality.

That is, a display device includes the active matrix substrate as described above and a counter substrate disposed to face the active matrix substrate and bonded to the active matrix substrate via a frame-like sealing member. The display device has a display region surrounded by the sealing member and a non-display region around the outer periphery of the display region.

In a region of the active matrix substrate which will serve as the display region, for example, thin film transistors (TFTs) serving as switching elements are each provided to an associated one of a plurality of pixels. The TFTs include a semiconductor layer made of, for example, amorphous silicon (a-Si). Moreover, each pixel includes a pixel electrode connected to the TFT.

On the other hand, in a region of the active matrix substrate which will serve as the non-display region, a plurality of terminals are formed outside the sealing member. External circuits are connected to the plurality of terminals. Moreover, each terminal is formed at an end portion of a lead line extended from the display region.

FIG. 59 is an enlarged cross-sectional view illustrating a vicinity of a sealing member of a conventional display device. As illustrated in FIG. 59, a sealing member 103 is disposed between an active matrix substrate 101 and a counter substrate 102. On the active matrix substrate 101, a lead line 104 is formed in a formation region for the sealing member 103. The lead line 104 is covered with a gate insulating film 105 and a protection film 106 so that the lead line 104 is protected. Moreover, an interlayer insulating film 107 made of a photosensitive organic insulating film is formed on the gate insulating film 105 and the protection film 106. Although not shown, the interlayer insulating film 107 is also formed in the display region. On a surface of the interlayer insulating film 107 in the display region, pixel electrodes are formed. On the other hand, in the formation region for the sealing member 103, the sealing member 103 is formed on the surface of the interlayer insulating film 107.

Here, when an active matrix substrate including a plurality of a-Si TFTs formed thereon is fabricated, for example, a process using five masks is known. In the process using five masks, a gate material layer is patterned by using a first mask, and an a-Si layer is patterned by using a second mask. Further, a source material layer is patterned by using a third mask, and a photosensitive organic insulating film is patterned by using a fourth mask. By using the photosensitive organic insulating film as a mask, an insulating film such as a gate insulating film is etched. Then, an indium tin oxide (ITO) film which will serve as a pixel electrode is patterned by using a fifth mask.

Thus, in the formation region for the sealing member, in order to form the gate insulating film and the protection film which protect the lead line, an interlayer insulating film made of the photosensitive organic insulating film has to be left on the gate insulating film and the protection film.

However, in the display device described above, outside moisture permeates via an interface between the sealing member and the interlayer insulating film into a region surrounded by the sealing member (i.e., toward the display region), which leads to a problem where display quality is impaired, thereby reducing display reliability.

To address this problem, Patent Document 1 discloses that in the formation region for the sealing member, a groove is formed in the interlayer insulating film, and the sealing member is formed in the groove and on a surface of the interlayer insulating film at both sides of the groove. This configuration aims to prevent the permeation of moisture via the interface between the sealing member and the interlayer insulating film.

CITATION LIST

Patent Document

PATENT DOCUMENT 1: Japanese Patent Publication No. 2004-53815

SUMMARY OF THE INVENTION

Technical Problem

However, even when the permeation of moisture via the interface between the sealing member and the interlayer insulating film is reduced as in the display device disclosed in Patent Document 1, outside moisture may still permeate into the display region surrounded by the sealing member because the interlayer insulating film itself has moisture permeability.

The present invention was devised in view of the above-discussed problems. It is an objective of the present invention to ensure prevention of permeation of outside moisture into a region surrounded by a sealing member while a lead line is protected in a formation region for the sealing member.

Solution to the Problem

To achieve the objective above, a display device according to the present invention is directed to a display device including: an active matrix substrate; a counter substrate disposed to face the active matrix substrate; and a frame-like sealing member disposed between the active matrix substrate and the counter substrate, a display region being formed within the frame of the sealing member, and a non-display region including a formation region for the sealing member being formed around an outer periphery of the display region.

In the display region of the active matrix substrate, an interlayer insulating film made of a photosensitive organic insulating film, an insulating film different from the interlayer insulating film, and a plurality of pixel electrodes formed on a surface of the interlayer insulating film and arranged in a matrix pattern are provided, in the non-display region of the active matrix substrate, a lead line extended from the display region is formed, and in the formation region for the sealing member, the interlayer insulating film is removed, the insulating film is provided to cover part of the lead line, and the sealing member is directly formed on a surface of the insulating film.

Moreover, a method for fabricating a display device according to the present invention is directed to a method for fabricating a display device by bonding an active matrix substrate to a counter substrate via a frame-like sealing member.

The method includes: forming a first conductive film having a predetermined pattern on a substrate by using a first mask; forming a first insulating film covering the first conductive film on the substrate; forming a semiconductor layer having a predetermined pattern on the first insulating film by using a second mask; forming a second conductive film having a predetermined pattern on the first insulating film by using a third mask; forming an interlayer insulating film made of a photosensitive organic insulating film having a predetermined pattern by using a fourth mask to cover part of the first insulating film on which the semiconductor layer and the second conductive film have been formed; etching part of the first insulating film by using the interlayer insulating film as a mask; forming a transparent electrode having a predetermined pattern on the interlayer insulating film by using a fifth mask, wherein in the forming the first conductive film, part of the first conductive film is formed in a region in which the sealing member is to be formed, in the forming the semiconductor layer, part of the semiconductor layer is formed in the region in which the sealing member is to be formed, in the forming the interlayer insulating film, the interlayer insulating film on the semiconductor layer is removed in the region in which the sealing member is to be formed, in the etching part of the first insulating film, the first insulating film in the region in which the sealing member is to be formed is etched by using the semiconductor layer as a mask, in the forming the transparent electrode, the semiconductor layer in the region in which the sealing member is to be formed is removed by etching simultaneously with the forming the transparent electrode; and providing the sealing member on the first insulating film from which the semiconductor layer has been removed.

Moreover, a method for fabricating a display device according to the present invention is directed to a method for fabricating a display device by bonding an active matrix substrate to a counter substrate via a frame-like sealing member.

The method includes: forming a first conductive film having a predetermined pattern on a substrate by using a first mask; forming a first insulating film covering the first conductive film; forming a semiconductor layer having a predetermined pattern on the first insulating film by using a second mask; forming a second conductive film having a predetermined pattern on the first insulating film by using a third mask; forming an interlayer insulating film made of a photosensitive organic insulating film having a predetermined pattern by using a fourth mask to cover part of the first insulating film on which the semiconductor layer and the second conductive film have been formed; etching part of the first insulating film by using the interlayer insulating film as a mask; forming a common electrode having a predetermined pattern on a surface of the interlayer insulating film by using a fifth mask; forming a second insulating film having a predetermined pattern by using a sixth mask to cover the common electrode; forming a pixel electrode having a predetermined pattern by using a seventh mask on a surface of the second insulating film, wherein in the forming the semiconductor layer, the semiconductor layer is removed in a region in which the sealing member is to be formed, in the etching the part of the first insulating film, the first insulating film on the first conductive film is removed in the region in which the sealing member is to be formed, in forming the second insulating film, part of the second insulating film is formed to cover the first conductive film in the region in which the sealing member is to be formed; and providing the sealing member directly on a surface of the second insulating film in the region in which the sealing member is to be formed.

Advantages of the Invention

According to the present invention, for a display device including an active matrix substrate, a counter substrate disposed to face the active matrix substrate, and a frame-like sealing member disposed between the active matrix substrate and the counter substrate, it is possible to ensure prevention of permeation of outside moisture into a region surrounded by the sealing member while a lead line is protected in a formation region for the sealing member.

DESCRIPTION OF EMBODIMENTS

Embodiments of the present invention will be described in detail below with reference to the drawings. The present invention is not limited to the following embodiments.

First Embodiment of Invention

FIGS. 1-23 illustrate a first embodiment of the present invention.

Figure 1:
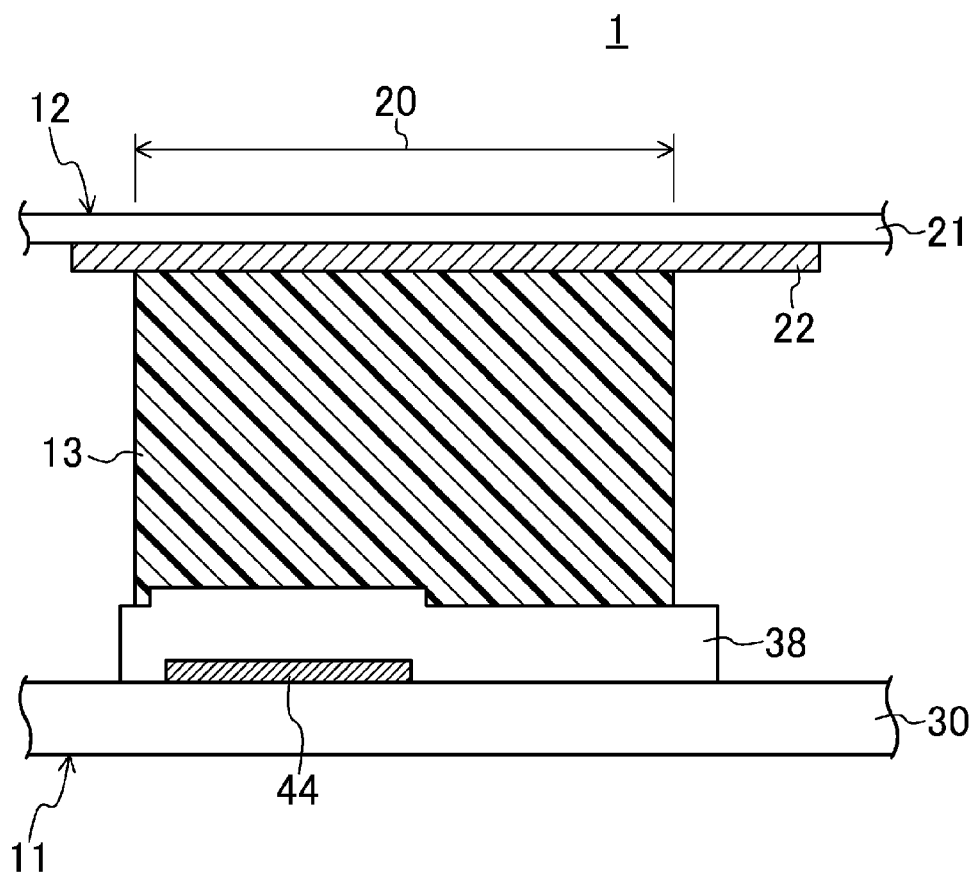
FIG. 1 is an enlarged cross-sectional view illustrating a vicinity of a sealing member of a display device of the first embodiment.
Figure 2:
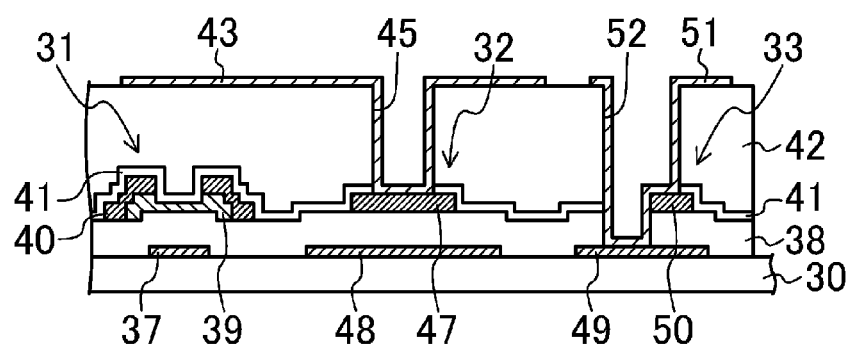
FIG. 2 is a cross-sectional view illustrating a pixel electrode formed by using a fifth mask of the first embodiment.
Figure 3:
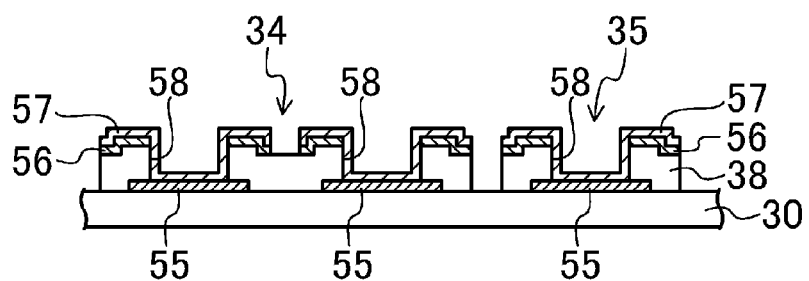
FIG. 3 is a cross-sectional view illustrating configurations of a COG terminal section and a FPC terminal section formed by using the fifth mask of the first embodiment.
Figure 4:
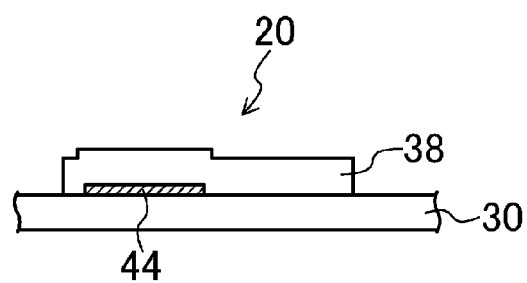
FIG. 4 is a cross-sectional view illustrating a configuration of a sealing member formation region of the first embodiment.

FIG. 1 is an enlarged cross-sectional view illustrating a vicinity of a sealing member of a display device of the first embodiment. FIG. 2 is a cross-sectional view illustrating a pixel electrode formed by using a fifth mask of the first embodiment. FIG. 3 is a cross-sectional view illustrating configurations of a COG terminal section and a FPC terminal section formed by using the fifth mask of the first embodiment. FIG. 4 is a cross-sectional view illustrating a configuration of a sealing member formation region of the first embodiment. FIGS. 5-22 are cross-sectional views illustrating fabrication processes of the display device of the first embodiment. FIG. 23 is a cross-sectional view schematically illustrating a configuration of a liquid crystal display device of the first embodiment.

In the first embodiment, a liquid crystal display device will be described as an example of the display device according to the present invention. As illustrated in FIG. 23, a liquid crystal display device 1 includes a TFT substrate 11 serving as an active matrix substrate, a counter substrate 12 disposed to face the TFT substrate 11, and a frame-like sealing member 13 disposed between the TFT substrate 11 and the counter substrate. Between the TFT substrate 11 and the counter substrate 12, a liquid crystal layer 14 is disposed and sealed by the sealing member 13.

A display region 15 is formed within the frame of the sealing member 13, and a non-display region 16 including a formation region 20 for the sealing member 13 is formed around the outer periphery of the display region 15. In the display region 15, a plurality of pixels each of which is a unit of display are formed in a matrix pattern.

At a side of the TFT substrate 11 opposite to the counter substrate 12, a backlight unit (not shown) serving as an illuminating device is disposed. The liquid crystal display device 1 is configured to selectively transmit light of the backlight unit therethrough to provide transmissive display.

As illustrated in FIG. 1, the counter substrate 12 includes a glass substrate 21 serving as a transparent substrate, and the glass substrate 21 includes a counter electrode 22 formed on a surface facing TFT substrate 11. The counter electrode 22 is formed from a transparent conductive film made of, for example, ITO.

As illustrated in FIGS. 2-4, the TFT substrate 11 includes a glass substrate 30 serving as a transparent substrate, and in the display region 15, TFTs 31, auxiliary capacitor sections 32, connection sections 33, COG terminal sections 34, and FPC terminal sections 35 are formed on the glass substrate 30.

Moreover, in the display region 15 of the TFT substrate 11, an interlayer insulating film 42 made of a photosensitive organic insulating film, a gate insulating film 38 which is an insulating film different from the interlayer insulating film 42, and a plurality of pixel electrodes 43 formed on a surface of the interlayer insulating film 42 and arranged in a matrix pattern are provided, wherein each of the pixel electrodes 43 is connected to a different one of the plurality of thin film transistor sections (TFTs) 31. The gate insulating film 38 is formed from an inorganic insulating film made of, for example, silicon nitride. Moreover, the pixel electrodes 43 are formed from a transparent conductive film made of, for example, ITO.

On the other hand, as illustrated in FIGS. 1 and 4, a lead line 44 extended from the display region 15 is formed in the non-display region 16 of the TFT substrate 11. In the formation region 20 for the sealing member 13, the interlayer insulating film 42 is removed, the gate insulating film 38 is disposed to cover part of the lead line 44, and the sealing member 13 is formed directly on a surface of the gate insulating film 38.

Each TFT 31 includes a gate electrode 37 formed on the glass substrate 30, the gate insulating film 38 covering the gate electrode 37, a semiconductor layer 39 formed on the surface of the gate insulating film 38, and drain and source electrodes 40 covering part of the semiconductor layer 39. The drain and source electrodes 40 are covered with a protection film 41 and the interlayer insulating film 42. The protection film 41 is formed from an inorganic insulating film made of, for example, silicon nitride.

The semiconductor layer 39 is made of an oxide semiconductor, for example, In—Ga—Zn—O (IGZO). Such an oxide semiconductor includes highly ionic bonds, and a difference in electron mobility between crystalline and amorphous substances is small. Thus, relatively high electron mobility is obtained even in an amorphous state. Moreover, the advantage that an amorphous film can be easily formed by, for example, sputtering at a room temperature is also provided.

As illustrated in FIG. 2, each auxiliary capacitor section 32 includes a first electrode 48 and a second electrode 47 facing each other with the gate insulating film 38 provided therebetween. The first electrode 48 is made of a gate material, and is formed on the glass substrate 30. The second electrode 47 is made of a source material, and is formed on the surface of the gate insulating film 38. Moreover, the second electrode 47 is connected to the pixel electrode 43 via a contact hole 45 penetrating the protection film 41 and the interlayer insulating film 42.

Each connection section 33 includes a connect layer 51 connecting a gate material layer 49 to a source material layer 50. The gate material layer 49 is formed on the glass substrate 30. The source material layer 50 is formed on the surface of the gate insulating film 38. The connect layer 51 is made of ITO, and is formed in a contact hole 52 penetrating the protection film 41 and the interlayer insulating film 42.

As illustrated in FIG. 3, each of the COG terminal sections 34 and the FPC terminal sections 35 includes a gate material layer 55 formed on the glass substrate 30, a semiconductor material layer 56, and an ITO layer 57. The semiconductor material layer 56 is formed on the surface of the gate insulating film 38. The ITO layer 57 is formed on a surface of the semiconductor material layer 56, and is connected to the gate material layer 55 via a contact hole 58 formed to penetrate the gate insulating film 38.

—Fabrication Method—

Next, a method for fabricating the liquid crystal display device 1 will be described.

The liquid crystal display device 1 is fabricated by bonding the TFT substrate 11 to the counter substrate 12 via the frame-like sealing member 13. The present invention has a particular feature in a step of fabricating the TFT substrate 11, and thus the step of fabricating the TFT substrate 11 will be described in detail.

(Step of Forming Gate Material Layer)

First, by using a first mask, a gate material layer 37, 44, 48, 49, 55 which is a first conductive film having a predetermined pattern is formed on the glass substrate 30 by photolithography. The gate material layer 37, 44, 48, 49, 55 has a layered structure composed of, for example, an Al layer, a Ti layer, and a TiN layer.

Figure 5:
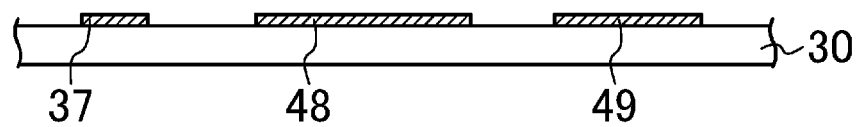
FIG. 5 is a cross-sectional view illustrating a gate material layer formed on a substrate by using a first mask of the first embodiment.
Figure 6:
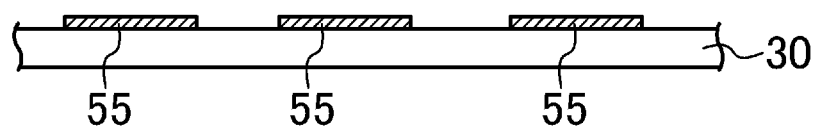
FIG. 6 is a cross-sectional view illustrating the gate material layer formed on the substrate by using the first mask of the first embodiment.
Figure 7:
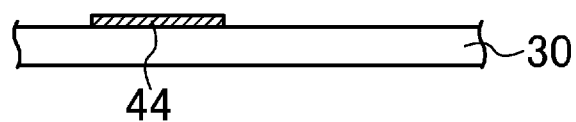
FIG. 7 is a cross-sectional view illustrating the gate material layer formed on the substrate by using the first mask of the first embodiment.

That is, as illustrated in FIG. 5, on the glass substrate 30, a gate electrode 37 is formed in a formation region for the TFT 31. Moreover, a first electrode 48 is formed in a formation region for an auxiliary capacitor section 32, and a gate material layer 49 is formed in a formation region for a connection section 33. Further, as illustrated in FIG. 6, a gate material layer 55 is formed in formation regions for a COG terminal section 34 and a FPC terminal section 35. Furthermore, as illustrated in FIG. 7, part of the gate material layer 37, 44, 47, 49, 55 forms a lead line 44 in a region 20 in which the sealing member 13 is to be formed.

(Step of Forming Gate Insulating Film)

Figure 8:
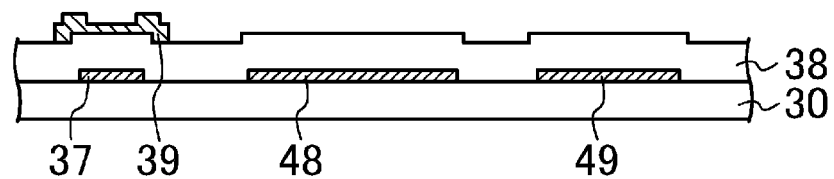
FIG. 8 is a cross-sectional view illustrating a semiconductor layer formed on a gate insulating film by using a second mask of the first embodiment.
Figure 9:
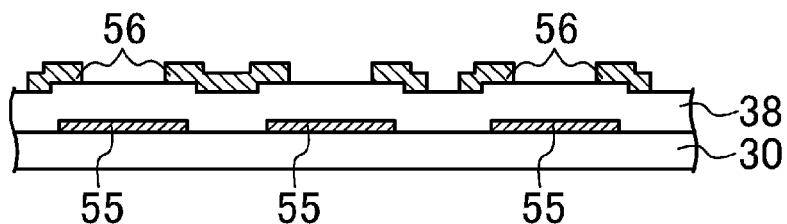
FIG. 9 is a cross-sectional view illustrating the semiconductor layer formed on the gate insulating film by using a second mask of the first embodiment.
Figure 10:
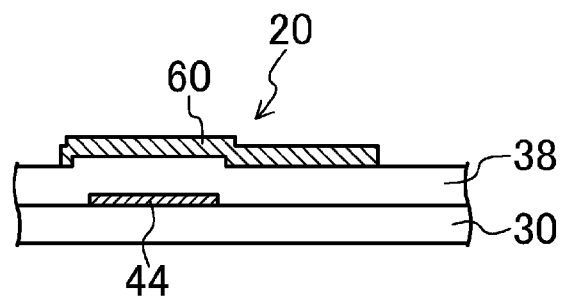
FIG. 10 is a cross-sectional view illustrating the semiconductor layer formed on the gate insulating film by using a second mask of the first embodiment.

Next, as illustrated in FIGS. 8-10, a gate insulating film 38 as a first insulating film covering the gate material layer (the gate electrode 37, the first electrode 48, the gate material layer 49, 55, the lead line 44) is formed on the glass substrate 30.

(Step of Forming Semiconductor Layer)

Next, as illustrated in FIGS. 8-10, by using a second mask, a semiconductor layer 39, 56, 60 having a predetermined pattern is formed on the gate insulating film 38 by photolithography.

That is, a semiconductor layer 39 is formed in the formation region for the TFT 31, and a semiconductor material layer 56 is formed in the formation regions for the COG terminal section 34 and the FPC terminal section 35. Moreover, a semiconductor layer 60 which is part of the semiconductor layer 39, 56, 60 is formed in the region in which the sealing member 13 is to be formed. The semiconductor layer 39, 56, 60 is made of an oxide semiconductor, for example, IGZO.

(Step of Forming Source Material Layer)

Figure 11:
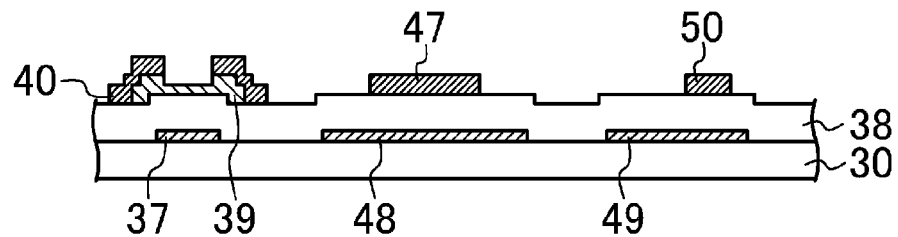
FIG. 11 is a cross-sectional view illustrating a source material layer formed on the gate insulating film by using a third mask of the first embodiment.
Figure 12:
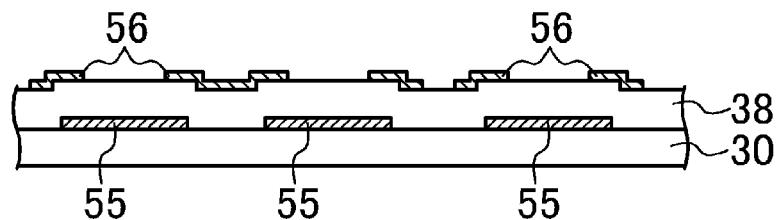
FIG. 12 is a cross-sectional view illustrating the semiconductor layer formed on the gate insulating film by using the third mask of the first embodiment.
Figure 13:
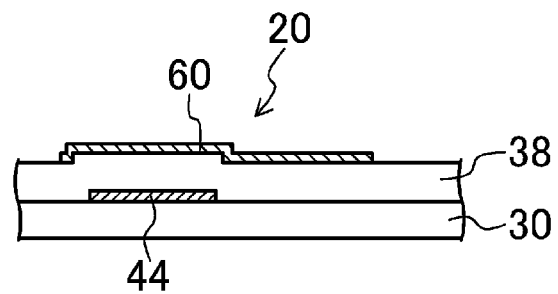
FIG. 13 is a cross-sectional view illustrating the semiconductor layer formed on the gate insulating film by using the third mask of the first embodiment.

Next, as illustrated in FIGS. 11-13, by using a third mask, a source material layer 40, 47, 50 which is a second conductive film having a predetermined pattern is formed on the gate insulating film 38 by photolithography. The source material layer 40, 47, 50 has, for example, a layered structure composed of a Ti layer, a MoN layer, an Al layer, and a MoN layer, a layered structure composed of a Ti layer, an Al layer, and a Ti layer, or a layered structure composed of a Cu layer, a Ti layer, a Cu layer, and a Mo layer.

That is, drain and source electrodes 40 are formed in the formation region for the TFT 31, a second electrode 47 is formed in the formation region for the auxiliary capacitor section 32, and a source material layer 50 is formed in the formation region for the connection section 33.

(Step of Forming Interlayer Insulating Film)

Figure 14:
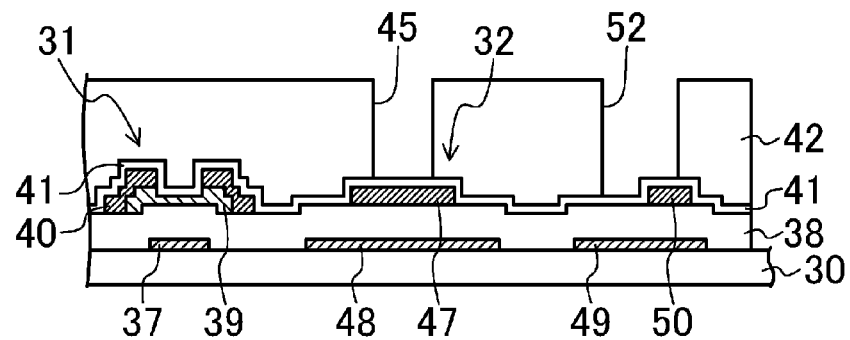
FIG. 14 is a cross-sectional view illustrating an interlayer insulating film formed on the substrate by using a fourth mask of the first embodiment.
Figure 15:
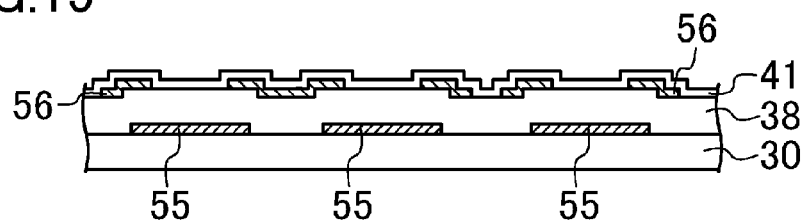
FIG. 15 is a cross-sectional view illustrating the semiconductor layer and the gate insulating film of the first embodiment, where the interlayer insulating film is removed.
Figure 16:
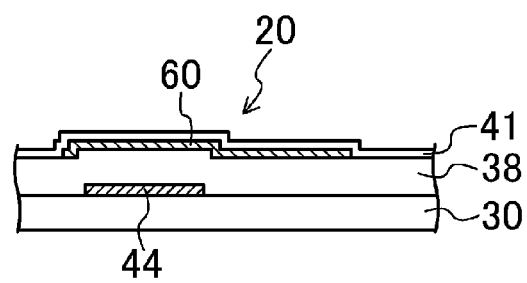
FIG. 16 is a cross-sectional view illustrating the semiconductor layer and the gate insulating film of the first embodiment, where the interlayer insulating film is removed.

Next, as illustrated in FIGS. 14-16, by using a fourth mask, an interlayer insulating film 42 having a predetermined pattern is formed by photolithography to cover part of the gate insulating film 38 on which the semiconductor layer 39, 56, 60 and the source material layer 40, 47, 50 have been formed. The interlayer insulating film 42 is formed from a photosensitive organic insulating film made of, for example, an acrylic organic resin.

That is, a material layer of a protection film 41 and a material layer of the interlayer insulating film 42 are stacked in this order on the entire surface of the glass substrate 30 including the region 20 in which the sealing member 13 is to be formed. The protection film 41 is formed from an inorganic insulating film made of, for example, silicon nitride. After that, by photolithography by using the fourth mask, the material layer of the interlayer insulating film 42 is removed in the region 20 in which the sealing member 13 is to be formed and in the regions in which the COG terminal section 34 and the FPC terminal section 35 are to be formed, a contact hole 45 is formed in the region in which the auxiliary capacitor section 32 is to be formed, and a contact hole 52 is formed in the region in which the connection section 33 is to be formed. In this way, the interlayer insulating film 42 on the semiconductor layer 60 is removed in the region 20 in which the sealing member 13 is to be formed.

(Step of Etching Gate Insulating Film)

Figure 17:
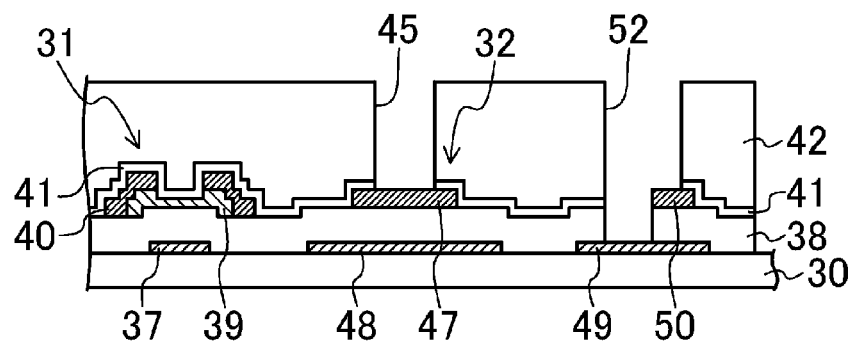
FIG. 17 is a cross-sectional view illustrating the gate insulating film and a protection film which have been etched in the first embodiment.
Figure 18:
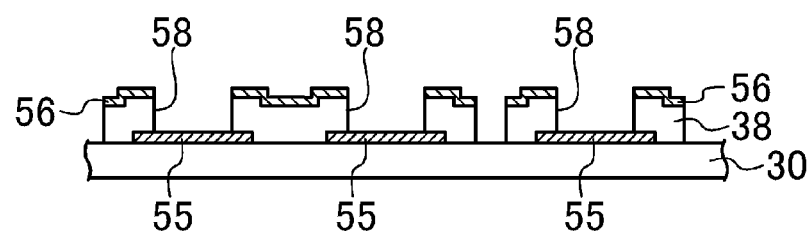
FIG. 18 is a cross-sectional view illustrating the gate insulating film which has been etched in the first embodiment.
Figure 19:
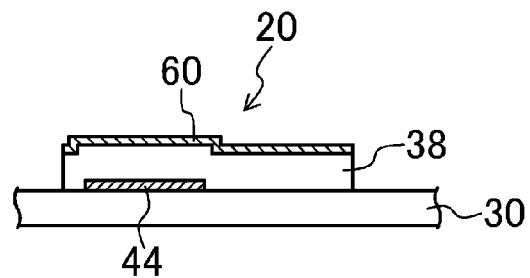
FIG. 19 is a cross-sectional view illustrating the gate insulating film which has been etched in the first embodiment.

Then, as illustrated in FIGS. 17-19, part of the gate insulating film 38 is etched by using the interlayer insulating film 42 as a mask. Here, the protection film 41 is also etched simultaneously with the gate insulating film 38.

As illustrated in FIG. 17, in the region in which the auxiliary capacitor section 32 is to be formed, the protection film 41 is etched in the contact hole 45, and in the region in which the connection section 33 is to be formed, the protection film 41 and the gate insulating film 38 are etched in the contact hole 52. Moreover, as illustrated in FIG. 18, in the regions in which the COG terminal section 34 and the FPC terminal section 35 are to be formed, the protection film 41 is removed, and the gate insulating film 38 exposed from the semiconductor material layer 56 is etched. Moreover, as illustrated in FIG. 19, in the region 20 in which the sealing member 13 is to be formed, the protection film 41 is removed, and the gate insulating film 38 exposed from the semiconductor layer 60 is etched.

As described above, in this step, in addition to the interlayer insulating film 42, the semiconductor layer 60 and the semiconductor material layer 56 can be used as a mask to etch the gate insulating film 38.

(Step of Forming Transparent Electrode)

Figure 20:
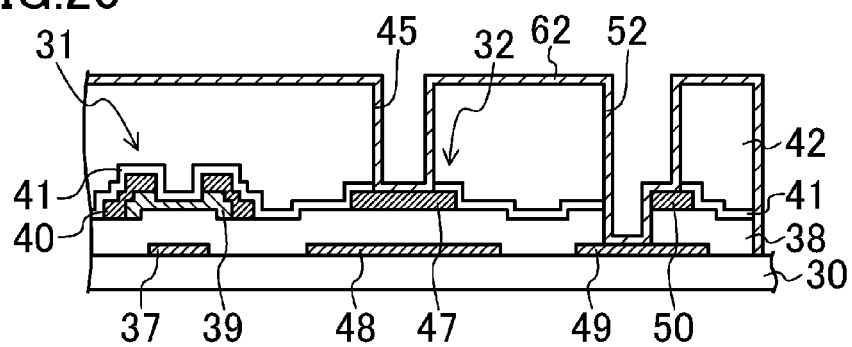
FIG. 20 is a view illustrating a cross-sectional view illustrating an ITO layer formed on the substrate in the first embodiment.
Figure 21:
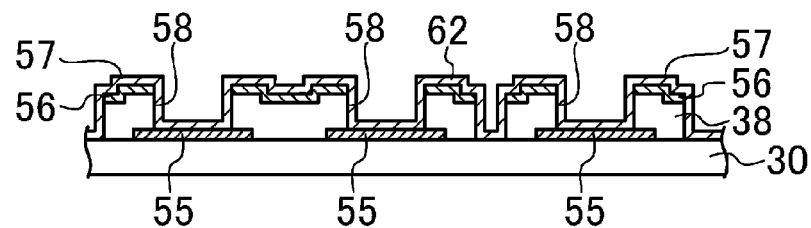
FIG. 21 is a view illustrating a cross-sectional view illustrating the ITO layer formed on the substrate in the first embodiment.
Figure 22:
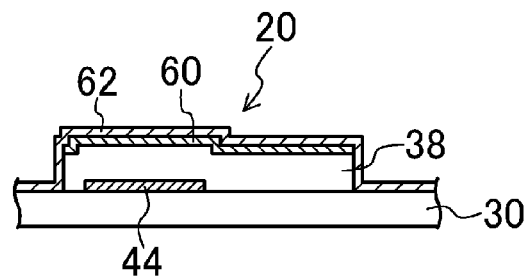
FIG. 22 is a view illustrating a cross-sectional view illustrating the ITO layer formed on the substrate in the first embodiment.
Figure 23:
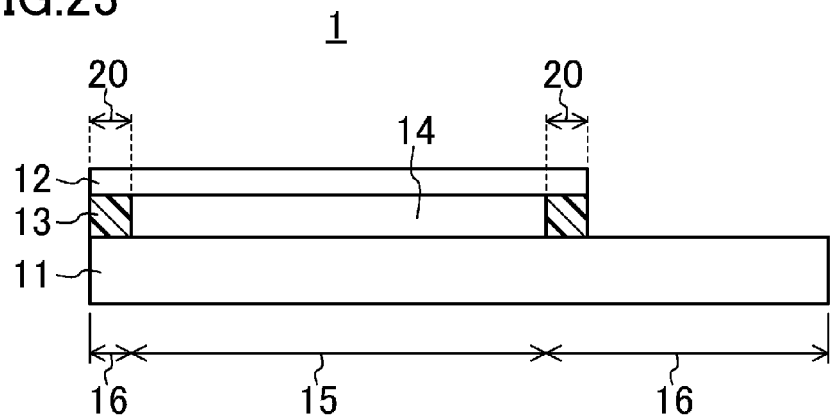
FIG. 23 is a cross-sectional view schematically illustrating a liquid crystal display device of the first embodiment.

Next, as illustrated in FIGS. 20-22, a transparent conductive layer 62 made of, for example, ITO is formed over the entire surface of the glass substrate 30.

Subsequently, as illustrated in FIGS. 2-4, by using a fifth mask, photolithography is performed on the transparent conductive layer 62, thereby forming a pixel electrode 43 as a transparent electrode having a predetermined pattern and a connect layer 51 on the interlayer insulating film 42.

That is, as illustrated in FIG. 2, the pixel electrode 43 is formed in the formation region for the TFT 31 and the formation region for the auxiliary capacitor section 32, and the connect layer 51 is formed in the formation region for the connection section 33. Moreover, an ITO layer 57 is formed in the formation regions for the COG terminal section 34 and the FPC terminal section 35.

In this step, etching is performed by using an etchant containing, for example, oxalic acid, salt iron, etc. Thus, the semiconductor layer 60 in the region 20 in which the sealing member 13 is to be formed can be removed by etching simultaneously with the formation of the pixel electrode 43. Moreover, in the formation region for the COG terminal section 34, the semiconductor material layer 56 and the transparent conductive layer 62 can be simultaneously etched to separate adjacent terminals from each other. Thus, the TFT substrate 11 is fabricated.

(Step of Forming Sealing Member)

Next, in the formation region 20 in which the sealing member 13 is to be formed and in which the semiconductor layer 60 has been removed, the sealing member 13 is provided on the gate insulating film 38. Here, the sealing member 13 is provided directly on the surface of the gate insulating film 38. Within the frame of the sealing member 13, a liquid crystal material is supplied by dropping, and then the TFT substrate 11 is bonded to the counter substrate 12 via the sealing member 13 and the liquid crystal layer 14. Thus, the liquid crystal display device 1 is fabricated.

—Advantages of First Embodiment—

Thus, according to the first embodiment, the lead line 44 can be protected by being covered with the gate insulating film 38 in the formation region 20 for the sealing member 13, and additionally, it is possible to ensure the prevention of the permeation of outer moisture into the region surrounded by the sealing member 13 because the interlayer insulating film 42 having moisture permeability is removed from the formation region 20 for the sealing member 13. Additionally, in etching the transparent conductive layer 62, the semiconductor layer 60, which is provided to leave the gate insulating film 38 in the formation region 20 for the sealing member 13, can be removed simultaneously with the transparent conductive layer 62. Thus, an increase in the number of steps can be avoided. As a result, a reduction in display quality can be prevented while fabrication costs are reduced.

Second Embodiment of Invention

FIGS. 24-36 illustrate a second embodiment of the present invention. In the following embodiments, the same reference numerals as those shown in FIGS. 1-23 are used to represent equivalent elements, and the detailed explanation thereof will be omitted in some cases.

Figure 24:
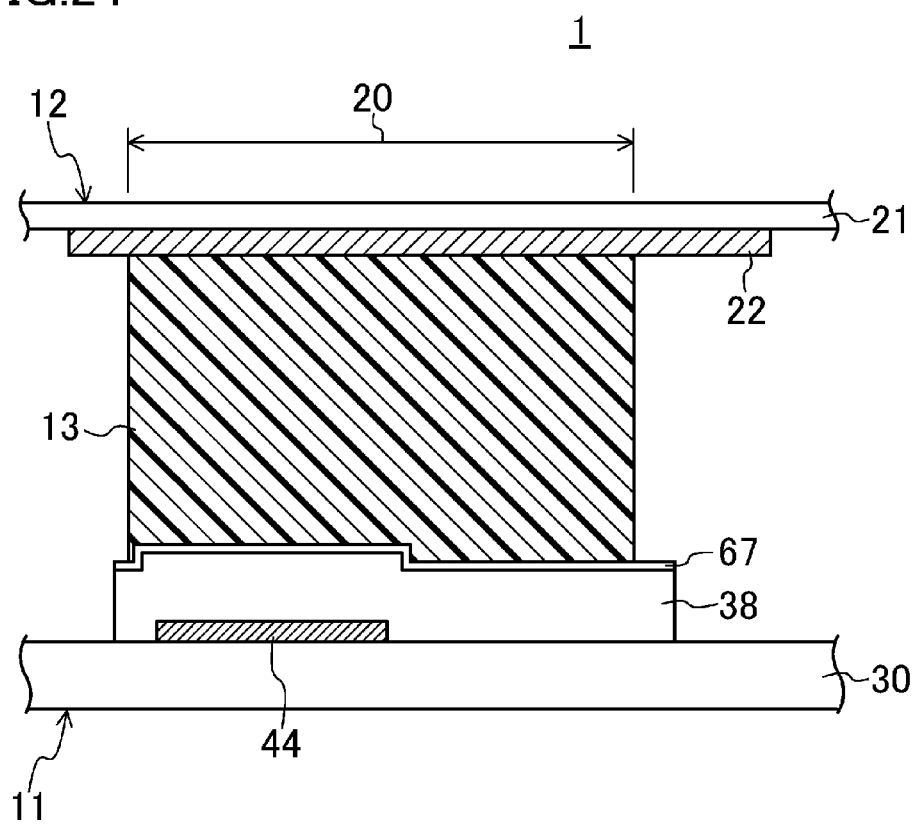
FIG. 24 is an enlarged cross-sectional view illustrating a vicinity of a sealing member of a display device of a second embodiment.
Figure 25:
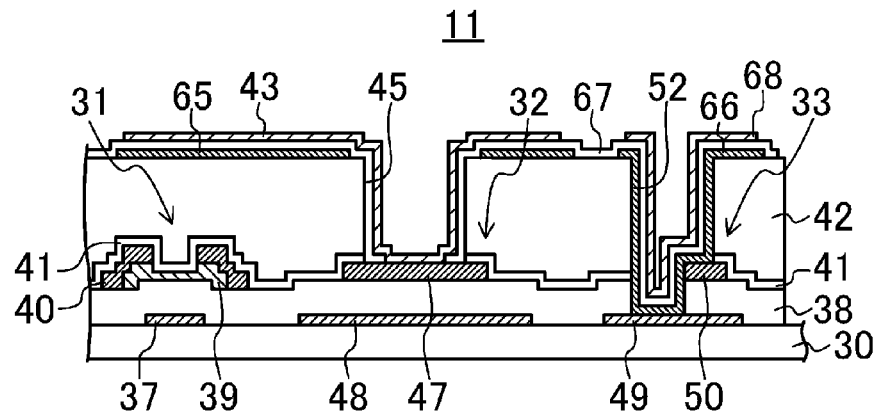
FIG. 25 is a cross-sectional view illustrating a pixel electrode formed by using a seventh mask of the second embodiment.
Figure 26:
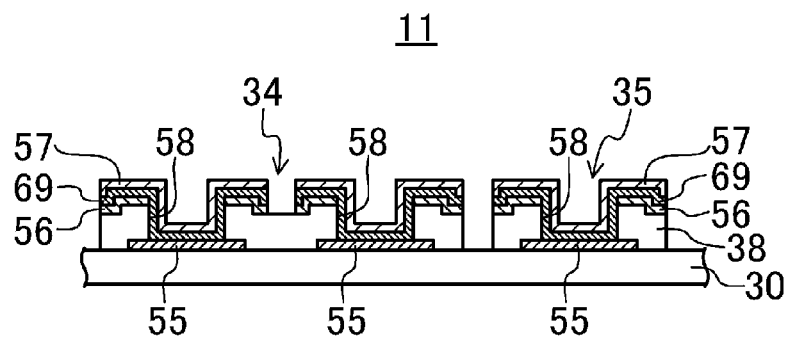
FIG. 26 is a cross-sectional view illustrating configurations of a COG terminal section and a FPC terminal section formed by using the seventh mask of the second embodiment.
Figure 27:
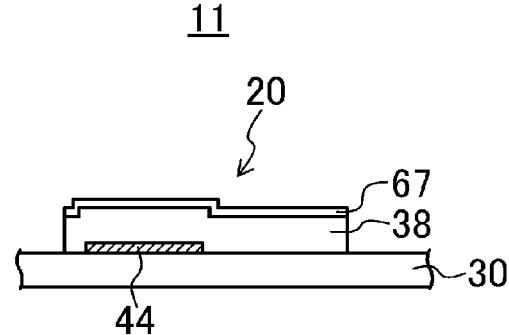
FIG. 27 is a cross-sectional view illustrating a configuration of a sealing member formation region of the second embodiment.

FIG. 24 is an enlarged cross-sectional view illustrating a vicinity of a sealing member of a display device of the second embodiment. FIG. 25 is a cross-sectional view illustrating a pixel electrode formed by using a seventh mask of the second embodiment. FIG. 26 is a cross-sectional view illustrating configurations of a COG terminal section and a FPC terminal section formed by using the seventh mask of the second embodiment. FIG. 27 is a cross-sectional view illustrating a configuration of a sealing member formation region of the second embodiment. FIGS. 28-36 are cross-sectional views illustrating fabrication processes of the display device of the second embodiment.

As illustrated in FIGS. 24 and 27, a liquid crystal display device 1 of the second embodiment includes an lead line 44, wherein in a formation region 20 for a sealing member 13, the lead line 44 is covered with an insulating film 38, 67 including a gate insulating film 38 and a second protection film 67 formed on a surface of the gate insulating film 38. The sealing member 13 is formed directly on a surface of the second protection film 67.

Moreover, as illustrated in FIG. 25, a TFT substrate 11 of the second embodiment includes a common electrode 65 and a pixel electrode 43 serving as transparent electrodes made of, for example, ITO formed on an interlayer insulating film 42. That is, the common electrode 65 is formed on a surface of the interlayer insulating film 42, and the common electrode is covered with the second protection film 67. Moreover, the pixel electrode 43 is formed on the surface of the second protection film 67. In this way, capacitance is provided by the pixel electrode 43 and the common electrode 65 with a high aperture ratio being maintained.

Moreover, in a formation region for a connection section 33, a first connect layer 66 made of the same ITO material as the common electrode 65 is formed in a contact hole 52. In the contact hole 52 the first connect layer 66 is covered with the second protection film 67 and a second connect layer 68 made of the same ITO material as the pixel electrode 43. Moreover, in formation regions for a COG terminal section 34 and a FPC terminal section 35, an ITO layer 69 is disposed between a semiconductor material layer 56 and an ITO layer 57.

—Fabrication Method—

Next, a method for fabricating the liquid crystal display device 1 will be described.

The liquid crystal display device 1 is fabricated by bonding the TFT substrate 11 to a counter substrate 12 via the frame-like sealing member 13. The present invention has a particular feature in a step of fabricating the TFT substrate 11, and thus the step of fabricating the TFT substrate 11 will be described in detail.

First, in a similar manner as in the first embodiment, a step of forming a gate material layer, a step of forming a gate insulating film, a step of forming a semiconductor layer, a step of forming a source material layer, a step of forming an interlayer insulating film, and a step of etching the gate insulating film are performed.

(Step of Forming Gate Material Layer)

First, as illustrated in FIGS. 5-7, by using a first mask, a gate material layer 37, 44, 48, 49, 55 which is a first conductive film having a predetermined pattern is formed on a glass substrate 30 by photolithography. The gate material layer 37, 44, 48, 49, 55 has a layered structure composed of, for example, an Al layer, a Ti layer, and a TiN layer.

That is, as illustrated in FIG. 5, on the glass substrate 30, a gate electrode 37 is formed in a formation region for a TFT 31. Moreover, a first electrode 48 is formed in a formation region for an auxiliary capacitor section 32, and a gate material layer 49 is formed in a formation region for a connection section 33. Further, as illustrated in FIG. 6, a gate material layer 55 is formed in formation regions for a COG terminal section 34 and a FPC terminal section 35. Furthermore, as illustrated in FIG. 7, part of the gate material layer 37, 44, 48, 49, 55 forms a lead line 44 in a region 20 in which the sealing member 13 is to be formed.

(Step of Forming Gate Insulating Film)

Next, as illustrated in FIGS. 8-10, a gate insulating film 38 as a first insulating film covering the gate material layer (the gate electrode 37, the first electrode 48, the gate material layer 49, 55, the lead line 44) is formed on the glass substrate 30.

(Step of Forming Semiconductor Layer)

Next, as illustrated in FIGS. 8-10, by using a second mask, a semiconductor layer 39, 56, 60 having a predetermined pattern is formed on the gate insulating film 38 by photolithography.

That is, a semiconductor layer 39 is formed in the formation region for the TFT 31, and the semiconductor material layer 56 is formed in the formation regions for the COG terminal section 34 and the FPC terminal section 35. Moreover, a semiconductor layer 60 which is part of the semiconductor layer 39, 56, 60 is formed in the region in which the sealing member 13 is to be formed. The semiconductor layer 39, 56, 60 is made of an oxide semiconductor, for example, IGZO.

(Step of Forming Source Material Layer)

Next, as illustrated in FIGS. 11-13, by using a third mask, a source material layer 40, 47, 50 which is a second conductive film having a predetermined pattern is formed on the gate insulating film 38 by photolithography. The source material layer 40, 47, 50 has, for example, a layered structure composed of a Ti layer, a MoN layer, an Al layer, and a MoN layer, a layered structure composed of a Ti layer, an Al layer, and a Ti layer, or a layered structure composed of a Cu layer, a Ti layer, a Cu layer, and a Mo layer.

That is, drain and source electrodes 40 are formed in the formation region for the TFT 31, a second electrode 47 is formed in the formation region for the auxiliary capacitor section 32, and a source material layer 50 is formed in the formation region for the connection section 33.

(Step of Forming Interlayer Insulating Film)

Next, as illustrated in FIGS. 14-16, by using a fourth mask, an interlayer insulating film 42 having a predetermined pattern is formed by photolithography to cover part of the gate insulating film 38 on which the semiconductor layer 39, 56, 60 and the source material layer 40, 47, 50 have been formed. The interlayer insulating film 42 is formed from a photosensitive organic insulating film made of, for example, an acrylic organic resin.

That is, a material layer of a protection film 41 and a material layer of the interlayer insulating film 42 are stacked in this order over the entire surface of the glass substrate 30 including the region 20 in which the sealing member 13 is to be formed. The protection film 41 is formed from an inorganic insulating film made of, for example, silicon nitride. After that, by photolithography by using the fourth mask, the material layer of the interlayer insulating film 42 is removed in the region 20 in which the sealing member 13 is to be formed and the regions in which the COG terminal section 34 and the FPC terminal section 35 are to be formed, a contact hole 45 is formed in the region in which the auxiliary capacitor section 32 is to be formed, and a contact hole 52 is formed in the region in which the connection section 33 is formed. In this way, the interlayer insulating film 42 on the semiconductor layer 60 is removed in the region 20 in which the sealing member 13 is to be formed.

(Step of Etching Gate Insulating Film)

Then, as illustrated in FIGS. 17-19, part of the gate insulating film 38 is etched by using the interlayer insulating film 42 as a mask. Here, the protection film 41 is also etched simultaneously with the gate insulating film 38.

As illustrated in FIG. 17, in the region in which the auxiliary capacitor section 32 is to be formed, the protection film 41 is etched in the contact hole 45, and in the region in which the connection section 33 is to be formed, the protection film 41 and the gate insulating film 38 are etched in the contact hole 52. Moreover, as illustrated in FIG. 18, in the regions in which the COG terminal section 34 and the FPC terminal section 35 are to be formed, the protection film 41 is removed, and the gate insulating film 38 exposed from the semiconductor material layer 56 is etched. Moreover, as illustrated in FIG. 19, in the region 20 in which the sealing member 13 is to be formed, the protection film 41 is removed, and the gate insulating film 38 exposed from the semiconductor layer 60 is etched.

As described above, in this step, in addition to the interlayer insulating film 42, the semiconductor layer 60 and the semiconductor material layer 56 can be used as a mask to etch the gate insulating film 38.

(Step of Forming Transparent Electrode)

This step and subsequent steps of the second embodiment are different from those of the first embodiment.

Figure 28:
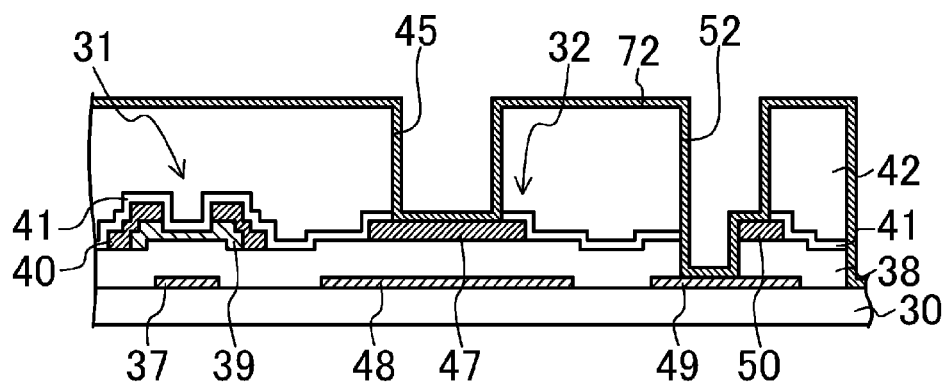
FIG. 28 is a cross-sectional view illustrating a transparent conductive layer formed on a glass substrate of the second embodiment.
Figure 29:
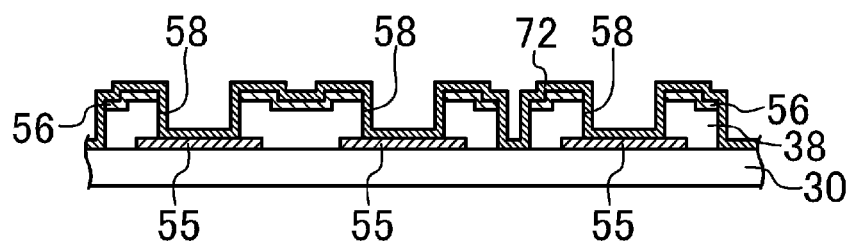
FIG. 29 is a cross-sectional view illustrating the transparent conductive layer formed on the glass substrate of the second embodiment.
Figure 30:
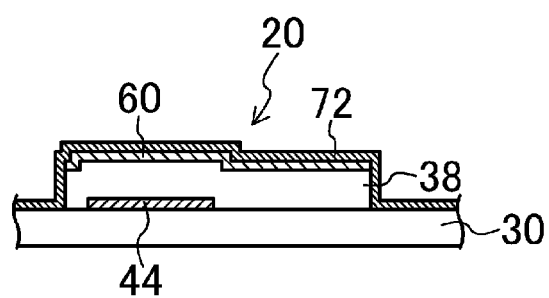
FIG. 30 is a cross-sectional view illustrating the transparent conductive layer formed on the glass substrate of the second embodiment.

As illustrated in FIGS. 28-30, a transparent conductive layer 72 made of, for example, ITO is formed over the entire surface of the glass substrate 30.

Figure 31:
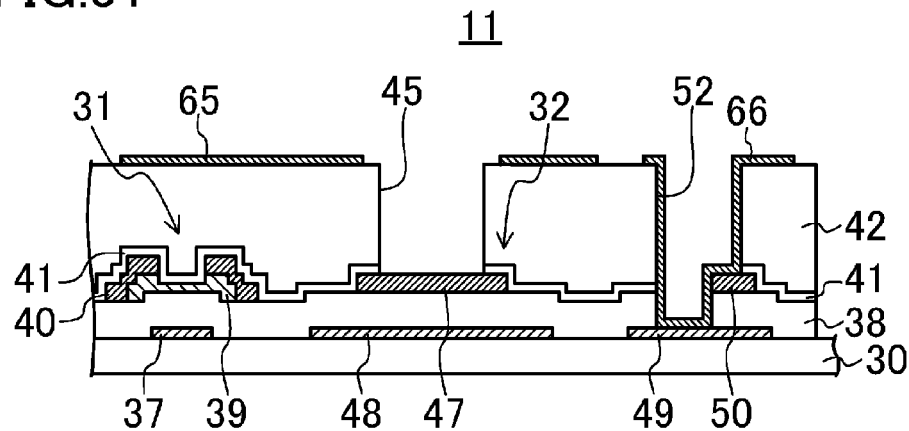
FIG. 31 is a cross-sectional view illustrating a common electrode and a first connect layer formed on the glass substrate of the second embodiment.
Figure 32:
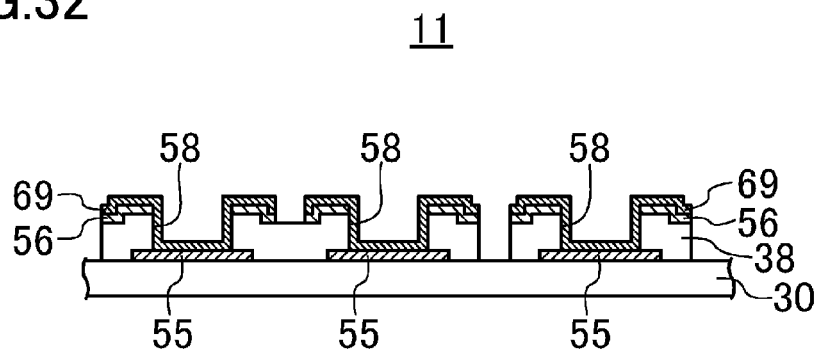
FIG. 32 is a cross-sectional view illustrating an ITO layer formed on the glass substrate of the second embodiment.
Figure 33:
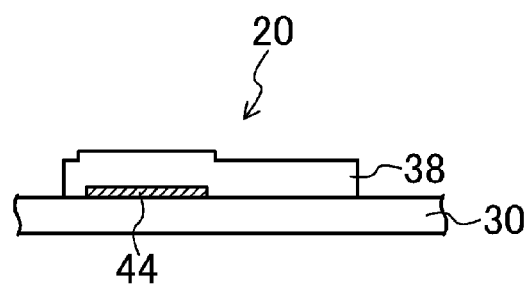
FIG. 33 is a cross-sectional view illustrating a gate insulating film of the second embodiment, where the transparent conductive layer is removed.

Subsequently, as illustrated in FIGS. 31-33, by using a fifth mask, photolithography is performed on the transparent conductive layer 72, thereby forming a common electrode 65 as a transparent electrode having a predetermined pattern and a first connect layer 66 on the interlayer insulating film 42.

That is, as illustrated in FIG. 31, the common electrode 65 is formed in the formation region for the TFT 31 and the formation region for the auxiliary capacitor section 32, and the first connect layer 66 is formed in the formation region for the connection section 33. Moreover, an ITO layer 69 is formed in the formation regions for the COG terminal section 34 and the FPC terminal section 35.

In this step, etching is performed by using an etchant containing, for example, oxalic acid, salt iron, etc. Thus, the semiconductor layer 60 in the region 20 in which the sealing member 13 is to be formed can be removed by etching simultaneously with the formation of the common electrode 65. Moreover, in the formation region for the COG terminal section 34, the semiconductor material layer 56 and the transparent conductive layer 72 can be simultaneously etched to separate adjacent terminals from each other.

(Step of Forming Second Protection Film)

Figure 34:
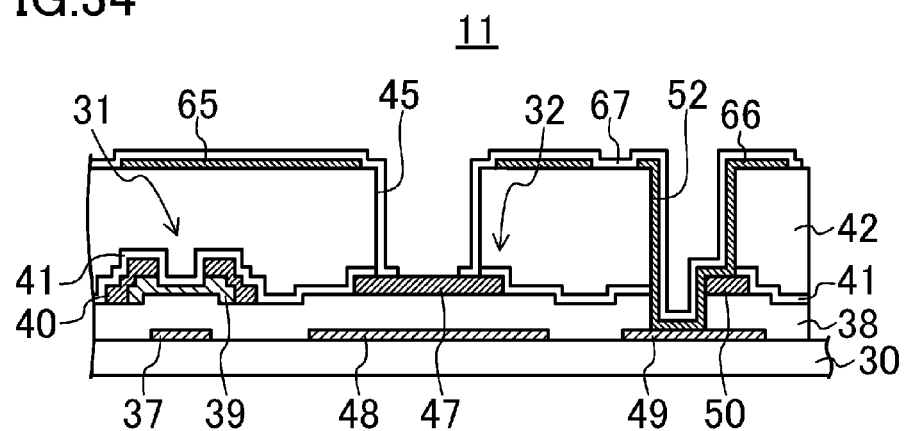
FIG. 34 is a cross-sectional view illustrating a second protection film formed on the glass substrate of the second embodiment.
Figure 35:
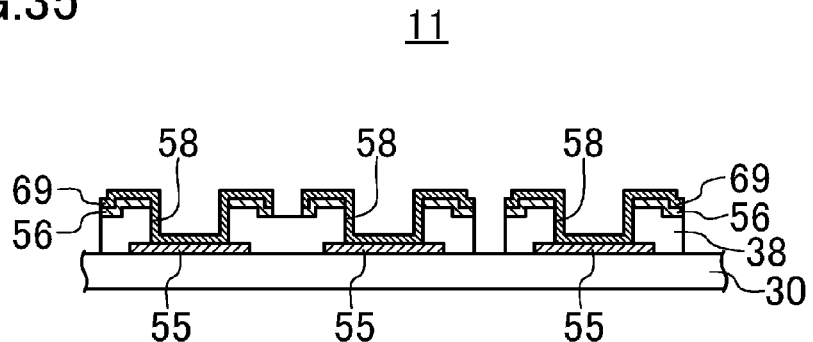
FIG. 35 is a cross-sectional view illustrating the ITO layer of the second embodiment, where the second protection film is removed.
Figure 36:
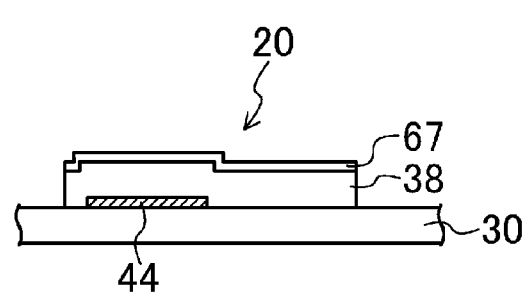
FIG. 36 is a cross-sectional view illustrating the second protection film formed on the gate insulating film of the second embodiment.

Next, as illustrated in FIGS. 34-36, by using a sixth mask, a second protection film 67 serving as a second insulating film having a predetermined pattern is formed to cover the common electrode 65.

That is, as illustrated in FIG. 34, the second protection film 67 covering the common electrode 65 is formed in the formation region for the TFT 31 and the formation region for the auxiliary capacitor section 32. In the contact hole 45, the first electrode 48 is exposed from the second protection film 67. On the other hand, in the contact hole 52, the first connect layer 66 is covered with the second protection film 67. Moreover, as illustrated in FIG. 35, the second protection film 67 is removed in the formation regions for the COG terminal section 34 and the FPC terminal section 35.

In this step, in the region 20 in which the sealing member 13 is to be formed, part of the second protection film 67 is formed on the gate insulating film 38. That is, as illustrated in FIG. 36, in the formation region 20 for the sealing member 13, the second protection film 67 is stacked on the surface of the gate insulating film 38.

(Step of Forming Pixel Electrode)

Next, as illustrated in FIGS. 25-27, by using a seventh mask, a pixel electrode 43 having a predetermined pattern is formed on the surface of the second protection film 67.

That is, as illustrated in FIG. 25, the pixel electrode 43 is formed in the formation region for the TFT 31 and the formation region for the auxiliary capacitor section 32, and a second connect layer 68 is formed in the formation region for the connection section 33. As a result, the pixel electrode 43 is connected to the first electrode 48 in the contact hole 45. Moreover, an ITO layer 57 is formed in the formation regions for the COG terminal section 34 and the FPC terminal section 35. Thus, the TFT substrate 11 is fabricated.

(Step of Forming Sealing Member)

Next, in the formation region 20 in which the sealing member 13 is to be formed and in which the semiconductor layer 60 has been removed, the sealing member 13 is provided on the gate insulating film 38 and the second protection film 67. Here, the sealing member 13 is provided directly on the surface of the second protection film 67. Within the frame of the sealing member 13, a liquid crystal material is supplied by dropping, and then the TFT substrate 11 is bonded to the counter substrate 12 via the sealing member 13 and the liquid crystal layer 14. Thus, the liquid crystal display device 1 is fabricated.

—Advantages of Second Embodiment—

Thus, according to the second embodiment, the lead line 44 can be protected by being covered with the gate insulating film 38 and the second protection film 67 in the formation region 20 for the sealing member 13, and additionally, it is possible to ensure the prevention of the permeation of outer moisture into the region surrounded by the sealing member 13 because the interlayer insulating film 42 having moisture permeability is removed from the formation region 20 for the sealing member 13. Additionally, in etching the transparent conductive layer 72, the semiconductor layer 60, which is provided to leave the gate insulating film 38 in the formation region 20 for the sealing member 13, can be removed simultaneously with the transparent conductive layer 72 in etching the transparent conductive layer 72. Thus, an increase in the number of steps can be avoided. As a result, a reduction in display quality can be prevented while fabrication costs are reduced.

Additionally, since the transparent common electrode 65 facing the pixel electrode 43 is formed, capacitance is provided by the pixel electrode 43 and the common electrode 65, allowing the display quality to be further improved while the aperture ratio is increased.

Third Embodiment of Invention

FIGS. 37-58 illustrate a third embodiment of the present invention.

Figure 37:
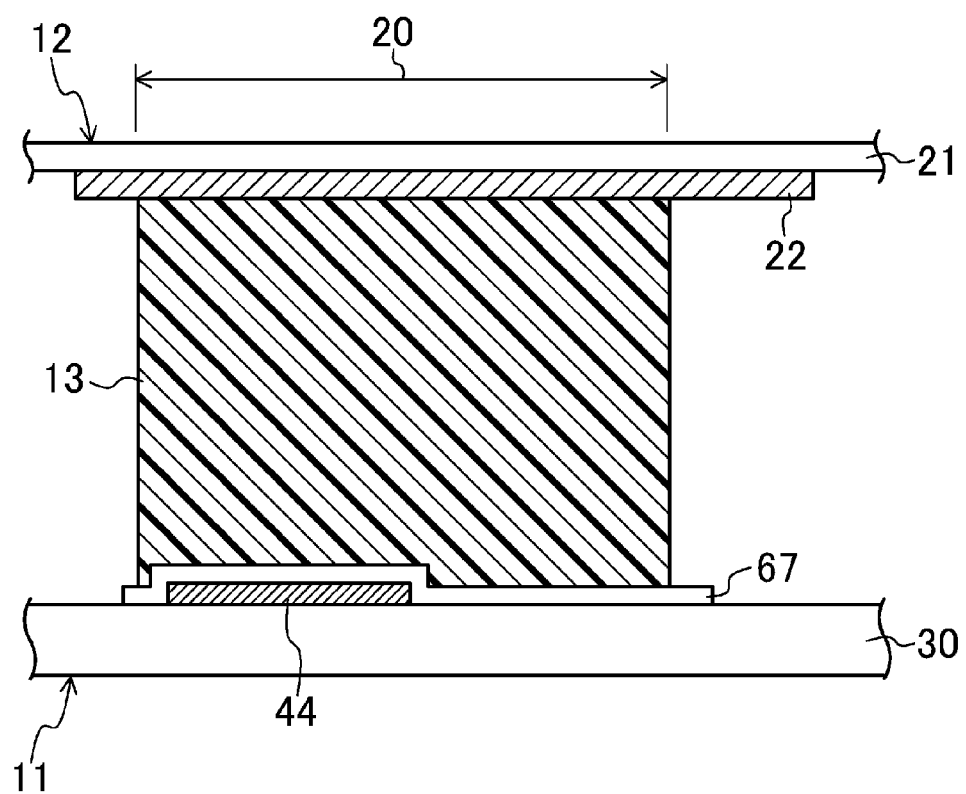
FIG. 37 is an enlarged cross-sectional view illustrating a vicinity of a sealing member of a display device of a third embodiment.
Figure 38:
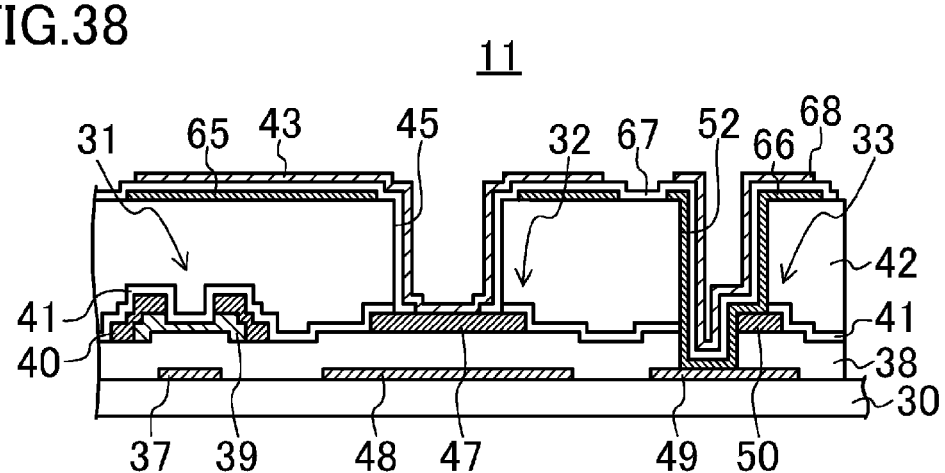
FIG. 38 is a cross-sectional view illustrating a pixel electrode formed by using a seventh mask of the third embodiment.
Figure 39:
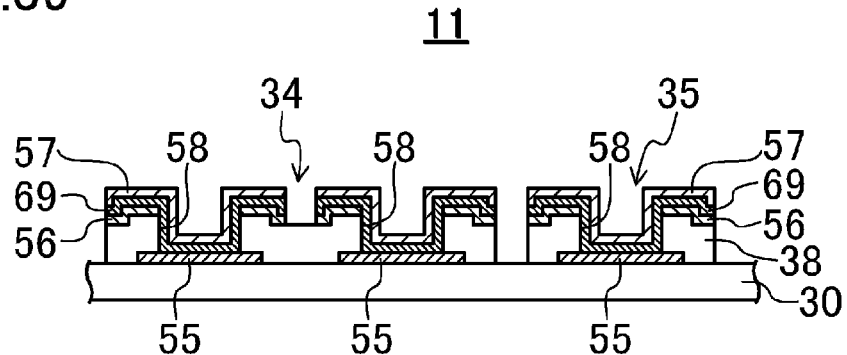
FIG. 39 is a cross-sectional view illustrating configurations of a COG terminal section and a FPC terminal section formed by using the seventh mask of the third embodiment.
Figure 40:
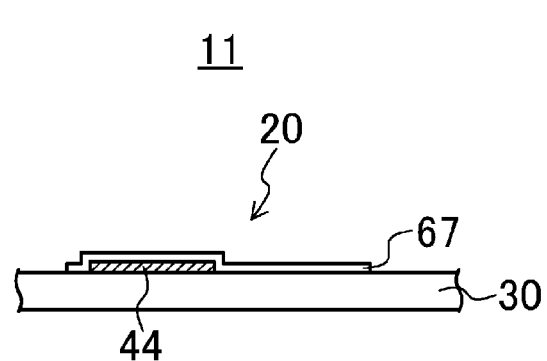
FIG. 40 is a cross-sectional view illustrating a configuration of a sealing member formation region of the third embodiment.

FIG. 37 is an enlarged cross-sectional view illustrating a vicinity of a sealing member of a display device of the third embodiment. FIG. 38 is a cross-sectional view illustrating a pixel electrode formed by using a seventh mask of the third embodiment. FIG. 39 is a cross-sectional view illustrating configurations of a COG terminal section and a FPC terminal section formed by using the seventh mask of the third embodiment. FIG. 40 is a cross-sectional view illustrating a configuration of a sealing member formation region of the third embodiment. FIGS. 41-58 are cross-sectional views illustrating fabrication processes of the display device of the third embodiment.

As illustrated in FIGS. 37 and 40, a liquid crystal display device 1 of the third embodiment includes a lead line 44 formed directly on a surface of a second protection film 67 in a formation region 20 for a sealing member 13 with a gate insulating film 38 being removed.

Moreover, as illustrated in FIG. 38, a TFT substrate 11 of the third embodiment includes a common electrode 65 and a pixel electrode 43 serving as transparent electrodes made of, for example, ITO, formed on an interlayer insulating film 42. That is, the common electrode 65 is formed on a surface of the interlayer insulating film 42, and the common electrode is covered with the second protection film 67. Moreover, the pixel electrode 43 is formed on the surface of the second protection film 67. In this way, capacitance is provided by the pixel electrode 43 and common electrode 65 with a high aperture ratio being maintained.

Moreover, in a formation region for a connection section 33, a first connect layer 66 made of the same ITO material as the common electrode 65 is formed in a contact hole 52. In the contact hole 52, the first connect layer 66 is covered with the second protection film 67 and a second connect layer 68 made of the same ITO material as the pixel electrode 43.

Moreover, in formation regions for a COG terminal section 34 and a FPC terminal section 35, an ITO layer 69 is disposed between a semiconductor material layer 56 and an ITO layer 57.

—Fabrication Method—

Next, a method for fabricating the liquid crystal display device 1 will be described.

The liquid crystal display device 1 is fabricated by bonding the TFT substrate 11 to a counter substrate 12 via the frame-like sealing member 13. The present invention has a particular feature in a step of fabricating the TFT substrate 11, and thus the step of fabricating the TFT substrate 11 will be described in detail.

(Step of Forming Gate Material Layer)

First, as illustrated in FIGS. 5-7, by using a first mask, a gate material layer 37, 44, 48, 49, 55 which is a first conductive film having a predetermined pattern is formed on a glass substrate 30 by photolithography. The gate material layer 37, 44, 48, 49, 55 has a layered structure composed of, for example, an Al layer, a Ti layer, and a TiN layer.

That is, as illustrated in FIG. 5, on the glass substrate 30, a gate electrode 37 is formed in a formation region for a TFT 31. Moreover, a first electrode 48 is formed in a formation region for an auxiliary capacitor section 32, and a gate material layer 49 is formed in a formation region for a connection section 33.

Further, as illustrated in FIG. 6, a gate material layer 55 is formed in formation regions for a COG terminal section 34 and a FPC terminal section 35. Furthermore, as illustrated in FIG. 7, part of the gate material layer 37, 44, 48, 49, 55 forms a lead line 44 in a region 20 in which the sealing member 13 is to be formed.

(Step of Forming Gate Insulating Film)

Figure 41:
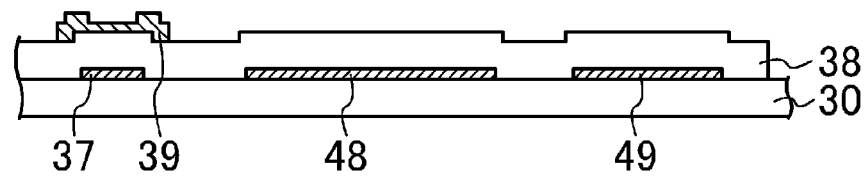
FIG. 41 is a cross-sectional view illustrating a semiconductor layer formed on a gate insulating film by using a second mask of the third embodiment.
Figure 42:
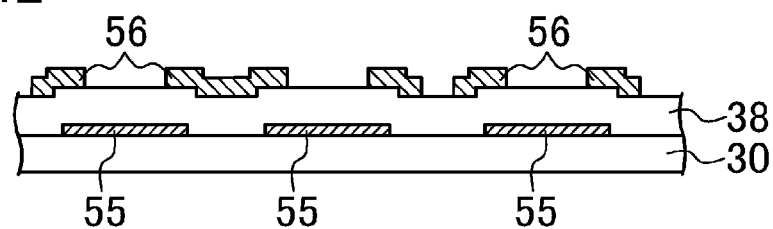
FIG. 42 is a cross-sectional view illustrating the semiconductor layer formed on the gate insulating film by using the second mask of the third embodiment.
Figure 43:
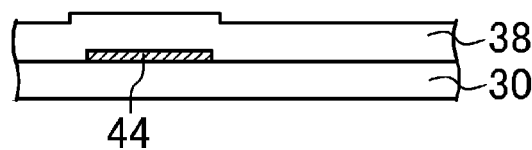
FIG. 43 is a cross-sectional view illustrating the gate insulating film of the third embodiment, where the semiconductor layer is removed.

Next, as illustrated in FIGS. 41-43, a gate insulating film 38 as a first insulating film covering the gate material layer (the gate electrode 37, the first electrode 48, the gate material layer 49, 55, the lead line 44) is formed on the glass substrate 30.

(Step of Forming Semiconductor Layer)

Next, as illustrated in FIGS. 41-43, by using a second mask, a semiconductor layer 39, 56 having a predetermined pattern is formed on the gate insulating film 38 by photolithography.

That is, a semiconductor layer 39 is formed in the formation region for the TFT 31, and a semiconductor material layer 56 is formed in the formation regions for the COG terminal section 34 and the FPC terminal section 35. The semiconductor layer 39, 56, 60 is made of an oxide semiconductor, for example, IGZO. On the other hand, in the region in which the sealing member 13 is to be formed, a semiconductor layer corresponding to the semiconductor layer 60 in the first and second embodiments is removed to expose the gate insulating film 38.

(Step of Forming Source Material Layer)

Figure 44:
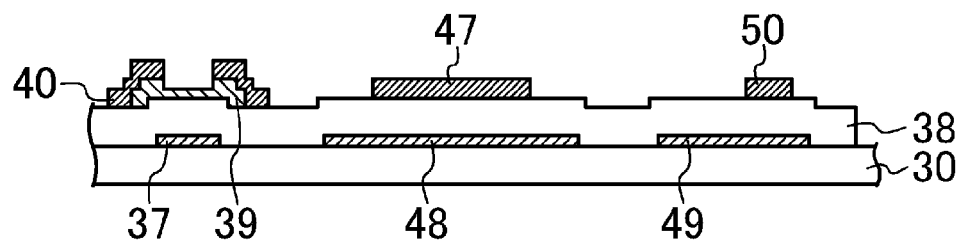
FIG. 44 is a cross-sectional view illustrating a source material layer formed on the gate insulating film by using a third mask of the third embodiment.
Figure 45:
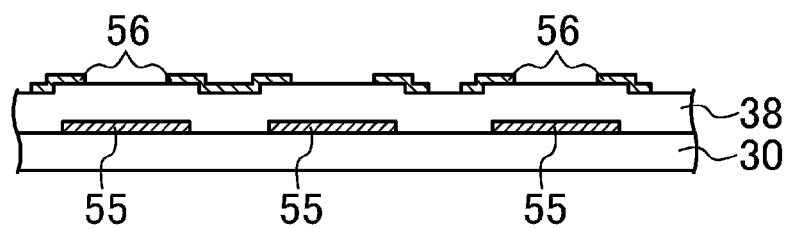
FIG. 45 is a cross-sectional view illustrating the semiconductor layer formed on the gate insulating film by using the third mask of the third embodiment.
Figure 46:
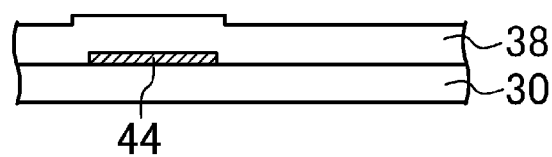
FIG. 46 is a cross-sectional view illustrating the gate insulating film of the third embodiment, where the semiconductor layer is removed.

Next, as illustrated in FIGS. 44-46, by using a third mask, a source material layer 40, 47, 50 which is a second conductive film having a predetermined pattern is formed on the gate insulating film 38 by photolithography. The source material layer 40, 47, 50 has, for example, a layered structure composed of a Ti layer, a MoN layer, an Al layer, and a MoN layer, a layered structure composed of a Ti layer, an Al layer, and a Ti layer, or a layered structure composed of a Cu layer, a Ti layer, a Cu layer, and a Mo layer.

That is, drain and source electrodes 40 are formed in the formation region for the TFT 31, a second electrode 47 is formed in the formation region for the auxiliary capacitor section 32, and a source material layer 50 is formed in the formation region for the connection section 33.

(Step of Forming Interlayer Insulating Film)

Figure 47:
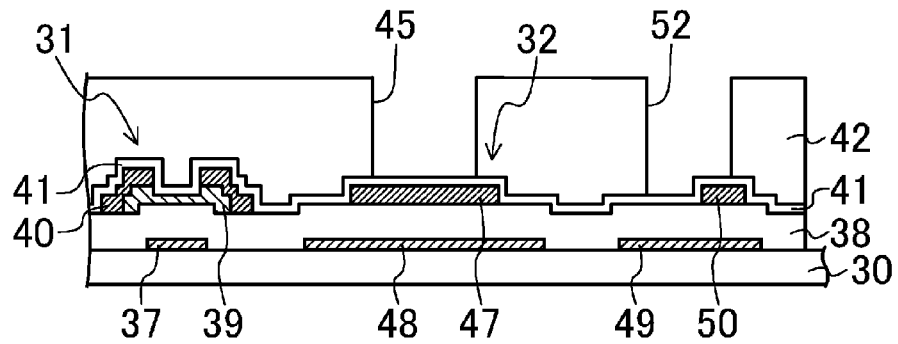
FIG. 47 is a cross-sectional view illustrating an interlayer insulating film formed on a substrate formed by using a fourth mask of the third embodiment.
Figure 48:
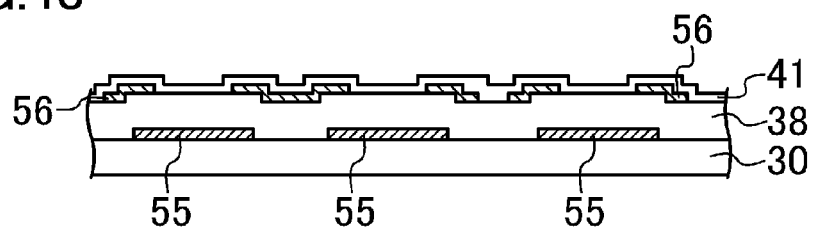
FIG. 48 is a cross-sectional view illustrating the semiconductor layer and the gate insulating film of the third embodiment, where the interlayer insulating film is removed.
Figure 49:
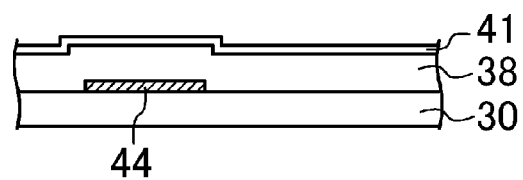
FIG. 49 is a cross-sectional view illustrating the gate insulating film of the third embodiment, where the interlayer insulating film is removed.

Next, as illustrated in FIGS. 47-49, by using a fourth mask, an interlayer insulating film 42 having a predetermined pattern is formed by photolithography to cover part of the gate insulating film 38 on which the semiconductor layer 39, 56 and the source material layer 40, 47, 50 have been formed. The interlayer insulating film 42 is formed from a photosensitive organic insulating film made of, for example, an acrylic organic resin.

That is, a material layer of a protection film 41 and a material layer of the interlayer insulating film 42 are stacked in this order over the entire surface of the glass substrate 30 including the region 20 in which the sealing member 13 is to be formed. The protection film 41 is formed from an inorganic insulating film made of, for example, silicon nitride. After that, by photolithography by using the fourth mask, the material layer of the interlayer insulating film 42 is removed in the region 20 in which the sealing member 13 is to be formed and the regions in which the COG terminal section 34 and the FPC terminal section 35 are to be formed, a contact hole 45 is formed in the region in which the auxiliary capacitor section 32 is to be formed, and a contact hole 52 is formed in the region in which the connection section 33 is formed. In this way, the interlayer insulating film 42 on the semiconductor layer 60 is removed in the region 20 in which the sealing member 13 is to be formed.

(Step of Etching Gate Insulating Film)

Figure 50:
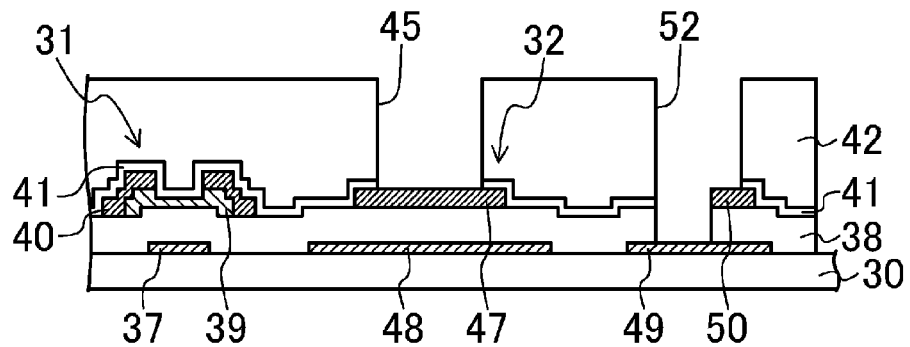
FIG. 50 is a cross-sectional view illustrating the gate insulating film and a protection film which have been etched in the third embodiment.
Figure 51:
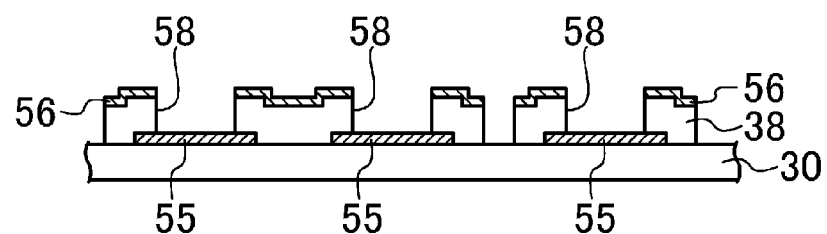
FIG. 51 is a cross-sectional view illustrating the gate insulating film which has been etched in the third embodiment.
Figure 52:
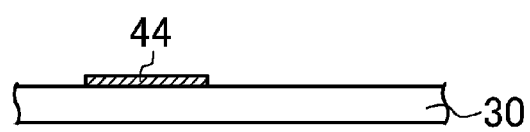
FIG. 52 is a cross-sectional view illustrating a lead line of the third embodiment, where the gate insulating film is removed.

Then, as illustrated in FIGS. 50-52, part of the gate insulating film 38 is etched by using the interlayer insulating film 42 as a mask. Here, the protection film 41 is also etched simultaneously with the gate insulating film 38.

As illustrated in FIG. 50, in the region in which the auxiliary capacitor section 32 is to be formed, the protection film 41 is etched in the contact hole 45, and in the region in which the connection section 33 is to be formed, the protection film 41 and the gate insulating film 38 are etched in the contact hole 52. Moreover, as illustrated in FIG. 51, in the regions in which the COG terminal section 34 and the FPC terminal section 35 are to be formed, the protection film 41 is removed, and the gate insulating film 38 exposed from the semiconductor material layer 56 is etched. Moreover, as illustrated in FIG. 52, in the region 20 in which the sealing member 13 is to be formed, the gate insulating film 38 and the protection film 41 on the lead line 44 is removed by etching.

As described above, in this step, in addition to the interlayer insulating film 42, the semiconductor layer 60 and the semiconductor material layer 56 can be used as a mask to etch the gate insulating film 38.

(Step of Forming Transparent Electrode)

Next, as illustrated in FIGS. 28-30, a transparent conductive layer 72 made of, for example, ITO is formed over the entire surface of the glass substrate 30.

Figure 53:
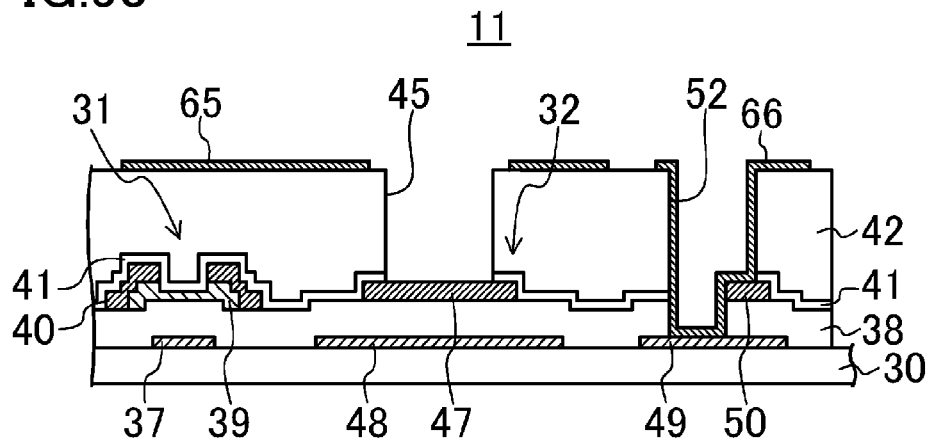
FIG. 53 is a cross-sectional view illustrating a common electrode and a first connect layer formed on a glass substrate of the third embodiment.
Figure 54:
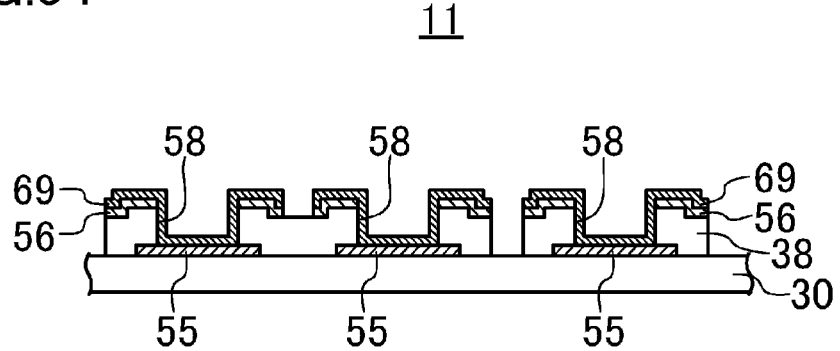
FIG. 54 is a cross-sectional view illustrating an ITO layer formed on the glass substrate of the third embodiment.
Figure 55:
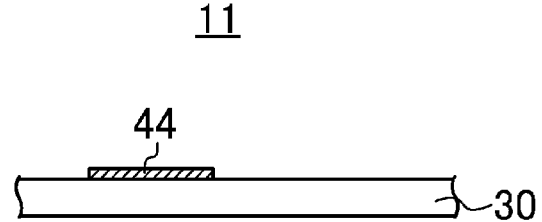
FIG. 55 is a cross-sectional view illustrating a lead line of the third embodiment, where the gate insulating film is removed.

Subsequently, as illustrated in FIGS. 53-55, by using a fifth mask, photolithography is performed on the transparent conductive layer 72, thereby forming a common electrode 65 as a transparent electrode having a predetermined pattern and a first connect layer 66 on the interlayer insulating film 42.

That is, as illustrated in FIG. 53, the common electrode 65 is formed in the formation region for the TFT 31 and the formation region for the auxiliary capacitor section 32, and the first connect layer 66 is formed in the formation region for the connection section 33. Moreover, an ITO layer 69 is formed in the formation regions for the COG terminal section 34 and the FPC terminal section 35.

In this step, etching is performed by using an etchant containing, for example, oxalic acid, salt iron, etc. Thus, the semiconductor layer 60 in the region 20 in which the sealing member 13 is to be formed can be removed by etching simultaneously with the formation of the common electrode 65. Moreover, in the formation region for the COG terminal section 34, the semiconductor material layer 56 and the transparent conductive layer 72 can be simultaneously etched to separate adjacent terminals from each other.

(Step of Forming Second Protection Film)

Figure 56:
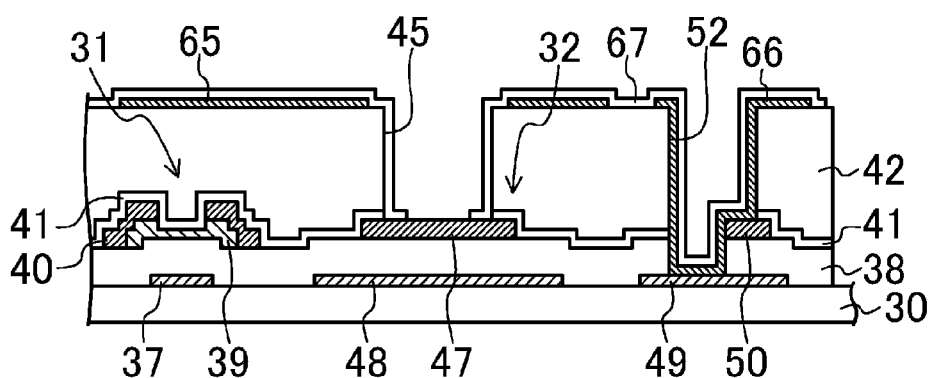
FIG. 56 is a cross-sectional view illustrating a second protection film formed on the glass substrate of the third embodiment.
Figure 57:
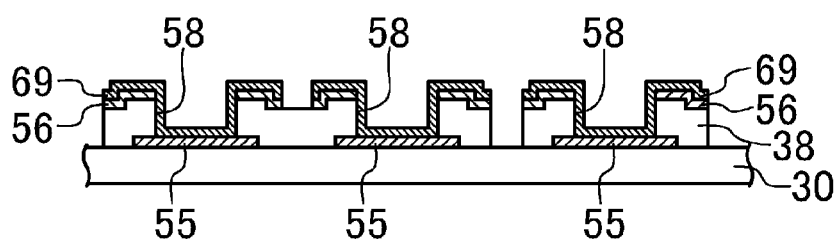
FIG. 57 is a cross-sectional view illustrating the ITO layer of the third embodiment, where the second protection film is removed.
Figure 58:
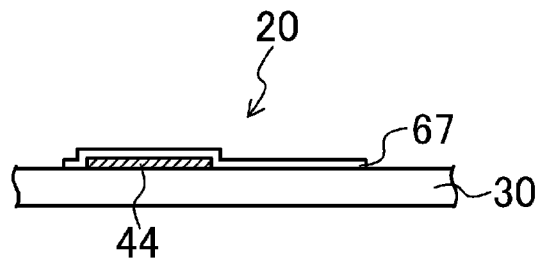
FIG. 58 is a cross-sectional view illustrating the second protection film formed on the glass substrate of the third embodiment.
Figure 59:
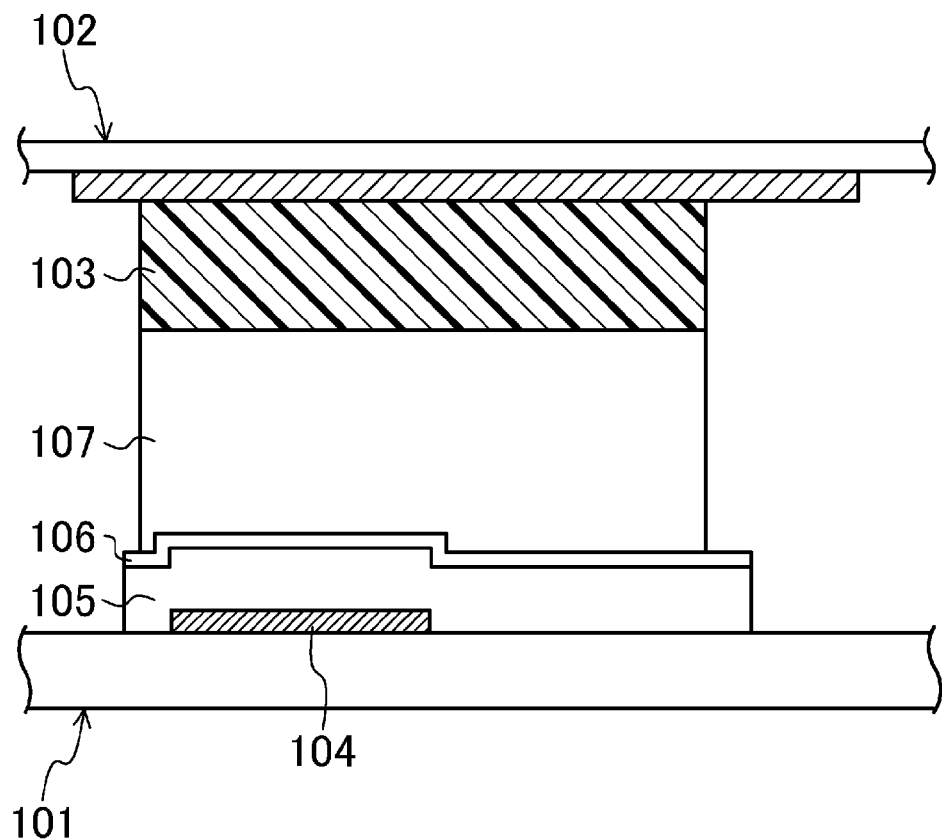
FIG. 59 is an enlarged cross-sectional view illustrating a vicinity of a sealing member of a conventional display device.

Next, as illustrated in FIGS. 56-58, by using a sixth mask, a second protection film 67 serving as a second insulating film having a predetermined pattern is formed to cover the common electrode 65.

That is, as illustrated in FIG. 56, the second protection film 67 covering the common electrode 65 is formed in the formation region for the TFT 31 and the formation region for the auxiliary capacitor section 32. In the contact hole 45, the first electrode 48 is exposed from the second protection film 67. On the other hand, in the contact hole 52, the first connect layer 66 is covered with the second protection film 67. Moreover, as illustrated in FIG. 57, the second protection film 67 is removed in the formation regions for the COG terminal section 34 and the FPC terminal section 35.

In this step, in the region 20 in which the sealing member 13 is to be formed, part of the second protection film 67 is formed to cover the lead line 44. That is, as illustrated in FIG. 58, in the formation region 20 for the sealing member 13, the second protection film 67 is stacked on the surfaces of the glass substrate 30 and the lead line 44.

(Step of Forming Pixel Electrode)

Next, as illustrated in FIGS. 38-40, by using a seventh mask, a pixel electrode 43 having a predetermined pattern is formed on the surface of the second protection film 67.

That is, as illustrated in FIG. 38, the pixel electrode 43 is formed in the formation region for the TFT 31 and the formation region for the auxiliary capacitor section 32, and a second connect layer 68 is formed in the formation region for the connection section 33. As a result, the pixel electrode 43 is connected to the first electrode 48 in the contact hole 45. Moreover, an ITO layer 57 is formed in the formation regions for the COG terminal section 34 and the FPC terminal section 35. Thus, the TFT substrate 11 is fabricated.

(Step of Forming Sealing Member)

Next, in the formation region 20 in which the sealing member 13 is to be formed, the sealing member 13 is provided directly on the surface of the second protection film 67. Within the frame of the sealing member 13, a liquid crystal material is supplied by dropping, and then the TFT substrate 11 is bonded to the counter substrate 12 via the sealing member 13 and the liquid crystal layer 14. Thus, the liquid crystal display device 1 is fabricated.

—Advantages of Third Embodiment—

Thus, according to the third embodiment, the lead line 44 can be protected by being covered with the second protection film 67 in the formation region 20 for the sealing member 13, and additionally, it is possible to ensure the prevention of the permeation of outer moisture into the region surrounded by the sealing member 13 because the interlayer insulating film 42 having moisture permeability is removed from the formation region 20 for the sealing member 13. Additionally, an increase in the number of steps can be avoided. As a result, a reduction in display quality can be prevented while fabrication costs are reduced.

Additionally, since the transparent common electrode 65 facing the pixel electrode 43 is formed, capacitance is provided by the pixel electrode 43 and the common electrode 65, allowing the display quality to be further improved while the aperture ratio is increased.

Other Embodiments

Although in the first to third embodiments, a liquid crystal display device has been described as an example, the present invention is not limited to this. Alternatively, the present invention is, in a similar manner, applicable to other thin display devices such as organic EL display devices.

Moreover, the present invention is not limited to the first to third embodiments, but the present invention includes configurations obtained by accordingly combining the first the third embodiments.

INDUSTRIAL APPLICABILITY

As described above, the present invention is useful for display devices and method for fabricating the same.

DESCRIPTION OF REFERENCE CHARACTERS

| 1 | Liquid Crystal Display Device |
|---|---|
| 11 | TFT Substrate (Active Matrix Substrate) |
| 12 | Counter Substrate |

| | | |
|---|---|---|
| 13 | Sealing Member | |
| 15 | Display Region | |
| 16 | Non-Display Region | |
| 20 | Formation Region for Sealing Member | |
| 21, 30 | Glass Substrate | |
| 31 | TFT (Thin Film Transistor) | |
| 37 | Gate Electrode | |
| 38 | Gate Insulating Film | |
| 39, 60 | Semiconductor Layer | |
| 40 | Drain and Source Electrodes | |
| 41 | Protection Film | |
| 42 | Interlayer Insulating Film | |
| 43 | Pixel Electrode (Transparent Electrode) | |
| 44 | Lead Line | |
| 47 | Second Electrode | |
| 48 | First Electrode | |
| 49, 55 | Gate Material Layer | |
| 50 | Source Material Layer | |
| 51 | Connect Layer | |
| 56 | Semiconductor Material Layer | |
| 57, 69 | ITO Layer | |
| 62, 72 | Transparent Conductive Layer | |
| 65 | Common Electrode (Transparent Electrode) | |
| 66 | First Connect Layer | |
| 67 | Second Protection Film (Protection Film) | |
| 68 | Second Connect Layer | |

What is claimed is:

1. A method for fabricating a display device by bonding an active matrix substrate to a counter substrate via a frame-like sealing member, the method comprising:
    forming a first conductive film having a predetermined pattern on a substrate by using a first mask;
    forming a first insulating film covering the first conductive film on the substrate;
    forming a semiconductor layer having a predetermined pattern on the first insulating film by using a second mask;
    forming a second conductive film having a predetermined pattern on the first insulating film by using a third mask;
    forming an interlayer insulating film made of a photosensitive organic insulating film having a predetermined pattern by using a fourth mask to cover part of the first insulating film on which the semiconductor layer and the second conductive film have been formed;
    etching part of the first insulating film by using the interlayer insulating film as a mask;
    forming a transparent electrode having a predetermined pattern on the interlayer insulating film by using a fifth mask, wherein
    in the forming the first conductive film, part of the first conductive film is formed in a region in which the sealing member is to be formed,
    in the forming the semiconductor layer, part of the semiconductor layer is formed in the region in which the sealing member is to be formed,
    in the forming the interlayer insulating film, the interlayer insulating film on the semiconductor layer is removed in the region in which the sealing member is to be formed,
    in the etching part of the first insulating film, the first insulating film in the region in which the sealing member is to be formed is etched by using the semiconductor layer as a mask,
    in the forming the transparent electrode, the semiconductor layer in the region in which the sealing member is to be formed is removed by etching simultaneously with the forming the transparent electrode; and
    providing the sealing member on the first insulating film from which the semiconductor layer has been removed.

2. The method of claim 1, wherein
in the providing the sealing member, the sealing member is provided directly on a surface of the first insulating film.

3. The method of claim 1, wherein
in the forming the transparent electrode, a pixel electrode as the transparent electrode is formed.

4. The method claim 1, wherein
in the forming the transparent electrode, a common electrode as the transparent electrode is formed, and
the method further comprises:
    forming a second insulating film having a predetermined pattern by using a sixth mask to cover the common electrode; and
    forming a pixel electrode having a predetermined pattern on a surface of the second insulating film by using a seventh mask, wherein
    in the forming the second insulating film, part of the second insulating film is formed on the first insulating film in the region in which the sealing member is to be formed, and
    in the providing the sealing member, the sealing member is provided directly on a surface of the second insulating film.

5. The method of claim 4, wherein
the second insulating film is a protection film.

6. The method of claim 1, wherein
the semiconductor layer is an oxide semiconductor layer.

7. The method of claim 6, wherein
the oxide semiconductor layer is made of In—Ga—Zn—O.

8. The method of claim 1, wherein
the first insulating film is a gate insulating film.

9. A method for fabricating a display device by bonding an active matrix substrate to a counter substrate via a frame-like sealing member, the method comprising:
    forming a first conductive film having a predetermined pattern on a substrate by using a first mask;
    forming a first insulating film covering the first conductive film;
    forming a semiconductor layer having a predetermined pattern on the first insulating film by using a second mask;
    forming a second conductive film having a predetermined pattern on the first insulating film by using a third mask;
    forming an interlayer insulating film made of a photosensitive organic insulating film having a predetermined pattern by using a fourth mask to cover part of the first insulating film on which the semiconductor layer and the second conductive film have been formed;
    etching part of the first insulating film by using the interlayer insulating film as a mask;
    forming a common electrode having a predetermined pattern on a surface of the interlayer insulating film by using a fifth mask;
    forming a second insulating film having a predetermined pattern by using a sixth mask to cover the common electrode;
    forming a pixel electrode having a predetermined pattern by using a seventh mask on a surface of the second insulating film, wherein
    in the forming the semiconductor layer, the semiconductor layer is removed in a region in which the sealing member is to be formed, in the etching the part of the first insulating film, the first insulating film on the first conductive film is removed in the region in which the sealing member is to be formed, in forming the second insulating film, part of the second insulating film is formed to cover the first conductive film in the region in which the sealing member is to be formed; and providing the sealing member directly on a surface of the second insulating film in the region in which the sealing member is to be formed.

10. The method of claim 9, wherein
the second insulating film is a protection film.

11. The method of claim 9, wherein
the semiconductor layer is an oxide semiconductor layer.

12. The method of claim 11, wherein
the oxide semiconductor layer is made of In—Ga—Zn—O.

13. The method of claim 9, wherein
the first insulating film is a gate insulating film.

* * * * *